United States Patent
Morita et al.

(10) Patent No.: US 10,724,137 B2
(45) Date of Patent: Jul. 28, 2020

(54) CLEANING METHOD, METHOD OF MANUFACTURING SEMICONDUCTOR DEVICE, SUBSTRATE PROCESSING APPARATUS, RECORDING MEDIUM, AND CLEANING COMPLETION DETERMINING METHOD

(71) Applicant: HITACHI KOKUSAI ELECTRIC INC., Tokyo (JP)

(72) Inventors: Osamu Morita, Toyama (JP); Shinichiro Mori, Toyama (JP); Kenji Kameda, Toyama (JP)

(73) Assignee: KOKUSAI ELETRIC CORPORATION, Tokyo (JP)

( * ) Notice: Subject to any disclaimer, the term of this patent is extended or adjusted under 35 U.S.C. 154(b) by 686 days.

(21) Appl. No.: 14/765,774

(22) PCT Filed: Jan. 28, 2014

(86) PCT No.: PCT/JP2014/051750
§ 371 (c)(1),
(2) Date: Aug. 4, 2015

(87) PCT Pub. No.: WO2014/123028
PCT Pub. Date: Aug. 14, 2014

(65) Prior Publication Data
US 2015/0368794 A1    Dec. 24, 2015

(30) Foreign Application Priority Data

Feb. 5, 2013    (JP) .................................. 2013-020670

(51) Int. Cl.
*C23C 16/44*    (2006.01)
*H01J 37/32*    (2006.01)
(Continued)

(52) U.S. Cl.
CPC .......... *C23C 16/4405* (2013.01); *C23C 16/22* (2013.01); *C23C 16/4412* (2013.01);
(Continued)

(58) Field of Classification Search
CPC .......... B01D 2258/0216; C23C 14/564; C23C 16/22; C23C 16/24; C23C 16/4401;
(Continued)

(56) References Cited

U.S. PATENT DOCUMENTS 4,705,669 A * 11/1987 Tsuji .................. G01N 33/0031
                                                                    137/599.03
5,060,505 A * 10/1991 Tury .................... G01N 21/274
                                                                    250/339.09
(Continued)

FOREIGN PATENT DOCUMENTS

JP    2000-235955 A    8/2000
JP    2002-057149 A    2/2002
(Continued)

OTHER PUBLICATIONS

J. P. Coates. "Chapter 4: Infrared Spectroscopy for Process Analytical Applications." in K. A. Bakeev, Ed. "Process Analytical Technology: Spectroscopic Tools and Implementation Strategies for the Chemical and Pharmaceutical Industries." 2005. pp. 91-132. Blackwell Publishing Ltd. (Year: 2005).*

(Continued)

*Primary Examiner* — Jeffrie R Lund
*Assistant Examiner* — Stanislav Antolin
(74) *Attorney, Agent, or Firm* — Volpe and Koenig, P.C.

(57) ABSTRACT

According to one aspect of the present disclosure, there is provided a cleaning method including: cleaning a component in which a deposit adhering to the component constituting an apparatus is removed by supplying and discharging a cleaning gas, wherein the act of cleaning includes controlling the apparatus so that a signal, which indicates a concentration of a predetermined gas generated by a reaction of the deposit and the cleaning gas, reaches a predetermined upper limit value or less and then stays within a range (Continued)

between the predetermined upper limit value and a predetermined lower limit value for a predetermined time period.

16 Claims, 16 Drawing Sheets

(51) Int. Cl.
| | | |
|---|---|---|
| C23C 16/22 | (2006.01) | |
| C23C 16/52 | (2006.01) | |
| H01L 21/66 | (2006.01) | |
| C23C 16/24 | (2006.01) | |
| C23C 16/455 | (2006.01) | |
| H01L 21/02 | (2006.01) | |

(52) U.S. Cl.
CPC ........ *C23C 16/52* (2013.01); *H01J 37/32862* (2013.01); *H01J 37/32981* (2013.01); *H01L 22/26* (2013.01); C23C 16/24 (2013.01); C23C 16/4408 (2013.01); C23C 16/45561 (2013.01); H01J 2237/022 (2013.01); H01J 2237/0225 (2013.01); H01L 21/02043 (2013.01)

(58) Field of Classification Search
CPC ............ C23C 16/4405; C23C 16/4412; C23C 16/45561; C23C 16/52; C23C 16/56; C30B 25/14; C30B 25/16; G01N 21/031; G01N 21/3504; H01L 21/67253; H01J 2237/022; H01J 37/32357; H01J 37/3244; H01J 37/32862; H01J 37/32935; H01J 37/3299
See application file for complete search history.

(56) References Cited

U.S. PATENT DOCUMENTS

| | | | | |
|---|---|---|---|---|
| 5,126,028 A * | 6/1992 | Hurwitt | ................... | C23C 14/04 204/192.13 |
| 5,528,039 A * | 6/1996 | Bernard | ................. | G01N 21/61 250/343 |
| 5,990,006 A * | 11/1999 | Thakur | ............. | H01L 21/67115 438/676 |
| 6,114,700 A * | 9/2000 | Blades | ............... | G01N 21/3504 250/343 |
| 6,422,056 B1 * | 7/2002 | Miyai | ................... | G01N 21/274 73/1.06 |
| 2001/0019900 A1 * | 9/2001 | Hasegawa | ........... | C23C 16/4401 438/765 |
| 2001/0020516 A1 * | 9/2001 | Khan | ................. | H01L 21/3065 156/345.24 |
| 2002/0022087 A1 * | 2/2002 | Satake | ............. | C23C 16/45512 427/255.28 |
| 2003/0034053 A1 * | 2/2003 | Nishimura | ............. | C03C 17/22 134/19 |
| 2003/0082919 A1 * | 5/2003 | Pau | ........................ | H01L 22/26 438/709 |
| 2003/0147075 A1 * | 8/2003 | Otsuki | ................ | C23C 16/4405 356/338 |
| 2003/0185966 A1 * | 10/2003 | Kim | ...................... | B08B 7/0035 427/8 |
| 2004/0002224 A1 * | 1/2004 | Chono | ............. | H01L 21/67017 438/714 |
| 2004/0007180 A1 * | 1/2004 | Yamasaki | ................ | C23C 16/16 118/715 |
| 2004/0011379 A1 | 1/2004 | Anaokar et al. | | |
| 2004/0159638 A1 * | 8/2004 | Demos | ................... | C23C 16/26 219/121.35 |
| 2004/0165193 A1 * | 8/2004 | Ohmoto | ............ | G01B 11/0625 356/504 |
| 2005/0090123 A1 * | 4/2005 | Nishimura | .......... | C23C 16/4405 438/800 |
| 2005/0095859 A1 * | 5/2005 | Chen | .................... | C23C 16/4481 438/689 |
| 2005/0139232 A1 * | 6/2005 | Choi | ................... | C23C 16/4405 134/2 |
| 2005/0224458 A1 | 10/2005 | Gaudet et al. | | |
| 2006/0201533 A1 * | 9/2006 | Wani | ................... | C23C 16/4405 134/1.1 |
| 2006/0207630 A1 * | 9/2006 | Sakai | ................... | C23C 16/4405 134/1.1 |
| 2007/0055403 A1 * | 3/2007 | MacDonald | ........... | G05B 13/04 700/108 |
| 2007/0261740 A1 | 11/2007 | Otsuki et al. | | |
| 2008/0047579 A1 * | 2/2008 | Ji | .......................... | B08B 7/0035 134/1.1 |
| 2008/0065340 A1 * | 3/2008 | Otsuki | ................ | C23C 16/4405 702/82 |
| 2008/0121177 A1 * | 5/2008 | Bang | ................... | C23C 16/4405 118/723 I |
| 2008/0121178 A1 * | 5/2008 | Bang | ................... | C23C 16/4405 118/723 I |
| 2008/0121179 A1 * | 5/2008 | Park | .................... | C23C 16/4405 118/723 R |
| 2008/0124944 A1 * | 5/2008 | Park | .................... | C23C 16/4401 438/778 |
| 2008/0283088 A1 * | 11/2008 | Shima | ............... | H01J 37/32862 134/1.1 |
| 2008/0305633 A1 * | 12/2008 | Itatani | ................ | C23C 16/4405 438/686 |
| 2009/0035945 A1 * | 2/2009 | Fujii | .................... | C23C 16/4405 438/758 |
| 2009/0186479 A1 * | 7/2009 | Okabe | ................... | C23C 16/409 438/680 |
| 2009/0277872 A1 * | 11/2009 | Yamamoto | ........ | H01J 37/32935 216/60 |
| 2009/0306808 A1 * | 12/2009 | Cho | .................... | C23C 16/4412 700/121 |
| 2010/0032587 A1 * | 2/2010 | Hosch | ..................... | H01J 37/06 250/492.3 |
| 2010/0139565 A1 * | 6/2010 | Otsuki | ................ | C23C 16/4405 118/728 |
| 2010/0197138 A1 * | 8/2010 | Cheshire | ............. | H01J 37/3244 438/694 |
| 2012/0152364 A1 * | 6/2012 | Hashimoto | ........ | G01N 33/0006 137/1 |
| 2012/0186604 A1 * | 7/2012 | Takano | ............... | C23C 16/4405 134/1.2 |
| 2012/0247511 A1 * | 10/2012 | Okada | .................... | C23C 16/345 134/19 |
| 2012/0260715 A1 * | 10/2012 | Miyai | ................... | G01N 21/274 73/1.07 |
| 2013/0016344 A1 * | 1/2013 | Bullock | ............ | H01J 37/32926 356/217 |
| 2013/0164943 A1 * | 6/2013 | Koshi | ............... | H01L 21/02057 438/758 |

FOREIGN PATENT DOCUMENTS

| | | | | |
|---|---|---|---|---|
| JP | 3300816 | B2 | 4/2002 | |
| JP | 2003-303777 | A | 10/2003 | |
| JP | 2004-281673 | A | 10/2004 | |
| JP | 3854157 | B2 | 9/2006 | |
| JP | 2007-531996 | A | 11/2007 | |
| JP | 2010-050483 | A | 3/2010 | |
| JP | 2010050483 | A * | 3/2010 | |
| JP | 4541739 | B2 | 7/2010 | |
| JP | 2013153159 | A * | 8/2013 | ....... H01L 21/02057 |
| JP | 2014-049684 | A | 3/2014 | |
| JP | 2014049684 | A * | 3/2014 | |

OTHER PUBLICATIONS

Cat. No. SSIS1027E04. "Model C7460 Multiband Plasma-Process Monitor (MPM)." Hamamatsu Photonics K.K., Systems Division. 2002. pp. 1-8. (Year: 2002).*

(56) References Cited

OTHER PUBLICATIONS

Taiwanese Office Action for Appln. No. 103103193 dated Dec. 24, 2015.
International Search Report, PCT/JP2014/051750, dated Apr. 1, 2014, 6 pages.

* cited by examiner

FIG. 6A

| No. | Maintenance name | Maintenance item | Current value | Scheduling start value | Maintenance limit value | Unit | Maintenance process |
|---|---|---|---|---|---|---|---|
| 17 | RCP Thick | Recipe film thickness value | 000000.00 | 000000 | 000000 | nn | Not designated |
| 18 | LV1-Check | Recipe film thickness value (step designation) | 000000.20 | 020000 | 025000 | nn | Maintenance job automatic start |

FIG. 6B

Maintenance setting

Table number: 18

--- Maintenance item information ---
Maintenance name: LV1-Check
Maintenance item: Recipe film thickness value (step designation)

--- Current value information ---
Current value (Monitor value): 000000.20  nn  [Current value change]

--- Scheduling start information ---
Scheduling start value: 020000  nn
Maintenance process: Maintenance job automatic start  Alarm Generation: No alarm --- Maintenance limit information ---
Maintenance limit value: 025000  nn
Maintenance process: Job execution prohibited

[OK]  [Cancel]

FIG. 7

| 1:       | 2:          | 3:      | 4:      |
|----------|-------------|---------|---------|
| 000:     | 191:ETCH-1  | 000:    | 000:    |

FIG. 8

| Maintenance job name | RCP Step Thick1 | |
|---|---|---|
| Executed recipe name | M_F2CLN_50_3L_R1 | Recipe name clear |

FIG. 9

End point detection item
- End point detection port type: AUX
- End point detection port: 2

Command specifications
- Film thickness maintenance item No.: 25: recipe film thickness value (step designation)
- Maximum cycle number calculation coefficient: 2.00

Error process
- Operation when reaching maximum cycle: Next job stop

FIG. 10

| Alarm | | Command | No | | AUX | Setting |
|---|---|---|---|---|---|---|
| Film thickness | I: STNGY-NG -000100.00 nn | recipe | 0: not selected | | | |

MFC | Details

| | Gas name | Setting value | | Lamp | Condition |
|---|---|---|---|---|---|
| 1 | | 000.000 | SOCM | 000.000 | M |
| 2 | | 000.000 | SLM | 000.000 | M |
| 3 | | 000.000 | SOCM | 000.000 | M |
| 4 | | 000.000 | SOCM | 000.000 | M |
| 5 | | 000.000 | SOCM | 000.000 | M |
| 6 | | 000.000 | SOCM | 000.000 | M |
| 7 | | 000.000 | SLM | 000.000 | M |
| 8 | | 000.000 | SOCM | 000.000 | M |
| 9 | | 000.000 | SOCM | 000.000 | M |
| 10 | | 000.000 | SOCM | 000.000 | M |
| 11 | | 000.000 | SOCM | 000.000 | M |
| 12 | | 000.000 | SLM | 000.000 | M |
| 13 | | 000.000 | SLM | 000.000 | M |

Temperature | Details

Mode
Correction
PID

| | Setting value (°C) | Lamp | Condition |
|---|---|---|---|
| U | 0000.0 | 000.00 | M |
| CU | 0000.0 | 000.00 | M |
| C | 0000.0 | 000.00 | M |
| CL | 0000.0 | 000.00 | M |
| L | 0000.0 | 000.00 | M |

Pressure

Mode  W
Command  APC valve control
PID  Pressure setting
Setting value  I: 0000.00 m

CLEANING METHOD, METHOD OF MANUFACTURING SEMICONDUCTOR DEVICE, SUBSTRATE PROCESSING APPARATUS, RECORDING MEDIUM, AND CLEANING COMPLETION DETERMINING METHOD

TECHNICAL FIELD

The present disclosure relates to recipe control in a substrate processing apparatus and, more particularly, to a technique of performing maintenance by executing a maintenance-purpose recipe.

BACKGROUND

There is available a batch-type substrate processing apparatus configured such that, in a state in which a substrate holder for holding substrates at multiple stages is loaded into a reaction furnace, the substrates held by the substrate holder are processed by supplying a process gas into the reaction furnace. For example, Patent Document 1 recites that a maintenance information image is displayed on an operation screen. Thus, the maintenance time of components constituting a substrate processing apparatus can be determined based on the use frequency of the respective components or the processing time.

Conventionally, in a substrate processing apparatus, each component that has reached a maintenance time is replaced by a new component. Therefore, the substrate processing apparatus is stopped. However, in recent years, from the viewpoint of improving an apparatus operation rate and automating an interior of a factory, it has been required to operate an apparatus in such a way as not to stop the apparatus as far as possible. Even in a vertical batch-type substrate processing apparatus, by executing a maintenance-purpose recipe from this viewpoint, a predetermined cleaning gas is supplied to remove byproducts adhering to members (a reaction tube, a substrate holder, etc.) that constitute an interior of a reaction furnace. For example, Patent Document 2 discloses that a deposit adhering to an inner wall of a reaction tube and so forth is removed by supplying a cleaning gas into the reaction tube. Furthermore, according to Patent Document 3, in a single-substrate-type substrate processing apparatus, if a deposited film deposited within a process chamber reaches a threshold value, a maintenance-purpose recipe is executed to remove an accumulated deposited film.

Incidentally, a step time for supplying a cleaning gas is calculated by calculating a cleaning completion time in advance and is set at the time thus calculated. Thus, it is not possible to determine whether the cleaning has been completed. In the meantime, if a film forming process is repeatedly performed, byproducts are generated. If the byproducts are left alone, they remain adhering to individual components which constitute an apparatus, thereby adversely affecting film formation. Thus, gas cleaning is performed at a predetermined period.

Conventionally, determination of completion of cleaning is made using a phenomenon that a temperature rise is generated by reaction heat at a cleaning time. That is to say, there has been used a method in which completion of cleaning is determined by setting a predetermined pre-cleaning temperature as a threshold value, comparing the threshold value with a predetermined measured value (temperature), and determining whether a pre-cleaning state comes back. However, in this method, an error is large and determination of completion of cleaning cannot be properly made.

PRIOR ART DOCUMENTS

Patent Documents

Patent Document 1: Japanese Patent No. 3300816
Patent Document 2: Japanese Patent No. 4541739
Patent Document 3: Japanese Patent No. 3854157

In view of such a situation, the present disclosure provides a technique capable of controlling a signal, which indicates a concentration of a predetermined gas generated by a cleaning gas, so as to fall within a predetermined range.

SUMMARY

According to one aspect of the present invention, there is provided a cleaning method, including: cleaning a component in which a deposit adhering to the component constituting an apparatus is removed by supplying and discharging a cleaning gas, wherein the act of cleaning includes controlling the apparatus so that a signal, which indicates a concentration of a predetermined gas generated by a reaction of the deposit and the cleaning gas, reaches a predetermined upper limit value or less and then stays within a range between the predetermined upper limit value and a predetermined lower limit value for a predetermined time period.

According to another aspect of the present invention, there is provided a method of manufacturing a semiconductor device, the method including: processing a substrate by supplying a process gas; and cleaning a component in which a deposit adhering to the component constituting an apparatus is removed by supplying and discharging a cleaning gas, wherein the act of cleaning includes controlling the apparatus so that a signal, which indicates a concentration of a predetermined gas generated by a reaction of the deposit and the cleaning gas, reaches a predetermined upper limit value or less and then stays within a range between the predetermined upper limit value and a predetermined lower limit value for a predetermined time period.

According to another aspect of the present invention, there is provided a substrate processing apparatus that processes a substrate by supplying a process gas, the apparatus including: a cleaning gas supply part configured to supply a cleaning gas; a discharge part configured to discharge the process gas or the cleaning gas; and a cleaning control part configured to control the cleaning gas supply part and the discharge part so as to remove a deposit adhering to a component constituting the apparatus by discharging a predetermined gas generated by a reaction of the deposit and the cleaning gas, wherein the cleaning control part controls the apparatus so that a signal indicating a concentration of the predetermined gas reaches a predetermined upper limit value or less and then stays within a range between the predetermined upper limit value and a predetermined lower limit value for a predetermined time period.

According to another aspect of the present invention, there is provided a non-transitory computer-readable recording medium which stores a cleaning completion determining program configured to clean a component constituting an apparatus, the program including: removing a deposit adhering to the component by supplying and discharging a cleaning gas; and controlling the apparatus so that a signal, which indicates a concentration of a predetermined gas generated by a reaction of the deposit and the cleaning gas, reaches a predetermined upper limit value or less and then stays within a range between the predetermined upper limit value and a predetermined lower limit value for a predetermined time period.

According to another aspect of the present invention, there is provided a method of determining completion of cleaning which cleans a component constituting an apparatus by supplying and discharging a cleaning gas, to the method including: determining whether a signal, which indicates a concentration of a predetermined gas generated by a reaction of a deposit adhering to the component and the cleaning gas, reaches a predetermined upper limit value or less and then stays within a range between the predetermined upper limit value and a predetermined lower limit value for a predetermined time period.

According to another aspect of the present invention, there is provided a method of manufacturing a semiconductor device, the method including: processing a substrate by supplying a process gas; and cleaning a component in which a deposit adhering to the component constituting an apparatus is removed by supplying and discharging a cleaning gas, wherein the act of cleaning includes determining whether a signal, which indicates a concentration of a predetermined gas generated by a reaction of the deposit and the cleaning gas, reaches a predetermined upper limit value or less and then stays within a range between the predetermined upper limit value and a predetermined lower limit value for a predetermined time period.

According to another aspect of the present invention, there is provided a substrate processing apparatus that processes a substrate by supplying a process gas, the apparatus including: a cleaning gas supply part configured to supply a cleaning gas; a discharge part configured to discharge the process gas or the cleaning gas; and a cleaning control part configured to control the cleaning gas supply part and the discharge part so as to remove a deposit adhering to a component constituting the apparatus by discharging a predetermined gas generated by a reaction of the deposit and the cleaning gas, wherein the discharge part includes a measuring part configured to measure a concentration of the predetermined gas, and the cleaning control part acquires a signal indicating the concentration of the predetermined gas using the measuring and determines whether the acquired signal reaches a predetermined upper limit value or less and then stays within a range between the predetermined upper limit value and a predetermined lower limit value for a predetermined time period.

According to another aspect of the present invention, there is provided a non-transitory computer-readable recording medium which stores a cleaning completion determining program configured to clean a component constituting an apparatus, the program including: removing a deposit adhering to the component by supplying and discharging a cleaning gas; measuring a concentration of a predetermined gas generated by a reaction of the deposit and the cleaning gas; and determining whether a signal indicating the concentration reaches a predetermined upper limit value or less and then stays within a range between the predetermined upper limit value and a predetermined lower limit value for a predetermined time period.

According to the present disclosure, control is performed so that a signal indicating a concentration of a predetermined gas generated by a cleaning gas stays within a predetermined range. Thus, the processing result of the substrate produced subsequently is stabilized, whereby the quality of the substrate is maintained.

BRIEF DESCRIPTION OF THE DRAWINGS

FIG. 6A is an illustrated example of a maintenance information list screen according to one embodiment of the present disclosure. FIG. 6B is an illustrated example of a maintenance item setting screen according to one embodiment of the present disclosure.

FIG. 7 is an illustrated example of a step setting screen for setting steps of a process recipe according to one embodiment of the present disclosure.

FIG. 8 is an illustrated example of a recipe setting screen for setting a maintenance-purpose recipe according to one embodiment of the present disclosure.

FIG. 9 is an illustrated example of a command setting screen of a sub recipe for executing a cleaning process according to one embodiment of the present disclosure.

FIG. 10 is an illustrated example of a sub recipe setting screen according to one embodiment of the present disclosure.

DETAILED DESCRIPTION

Embodiments of the present disclosure will now be described with reference to the drawings.

First, a substrate processing apparatus embodying the present disclosure will be described with reference to FIGS. 1 and 2.

Figure 1:
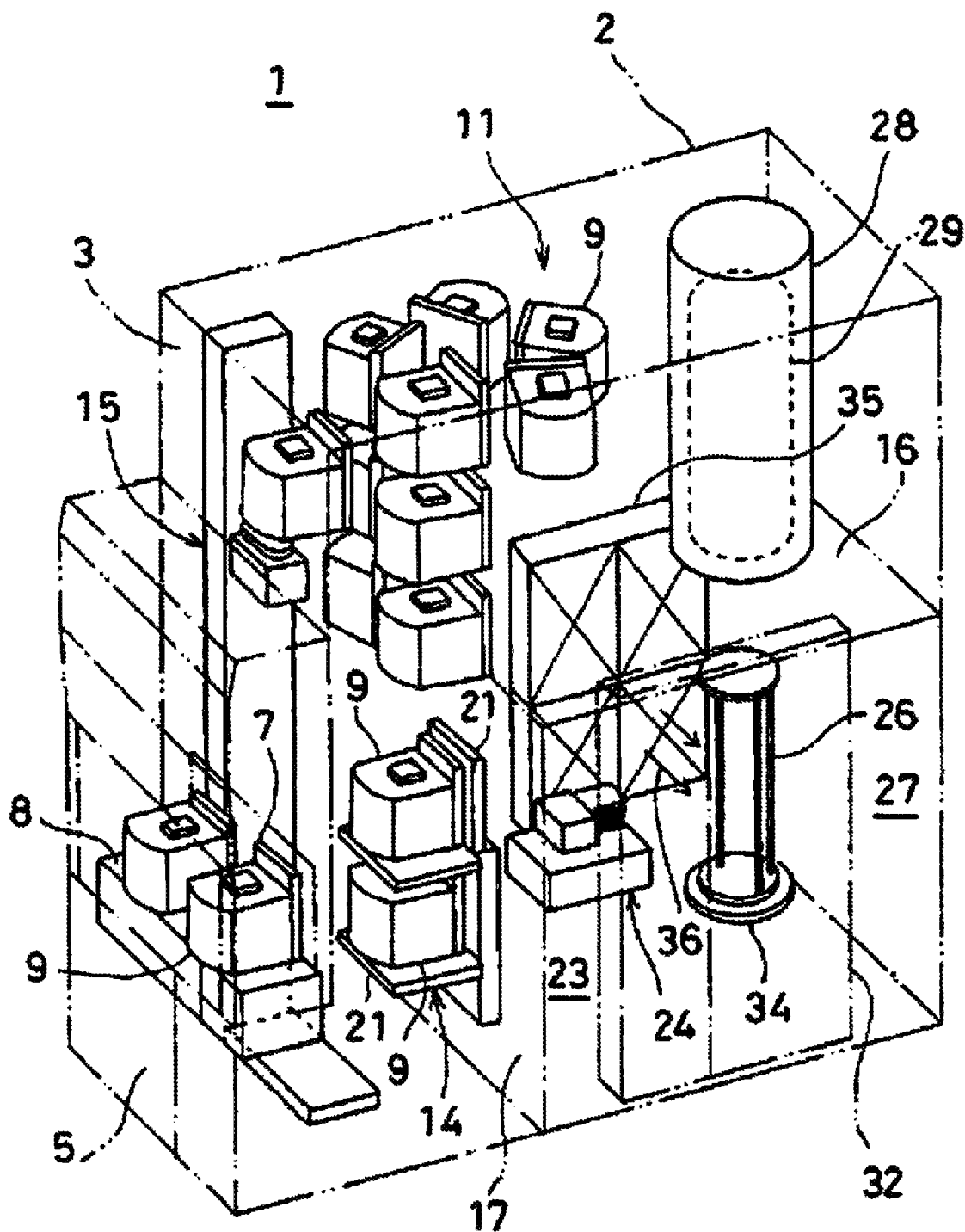
FIG. 1 is a perspective view illustrating a substrate processing apparatus according to the present disclosure.
Figure 2:
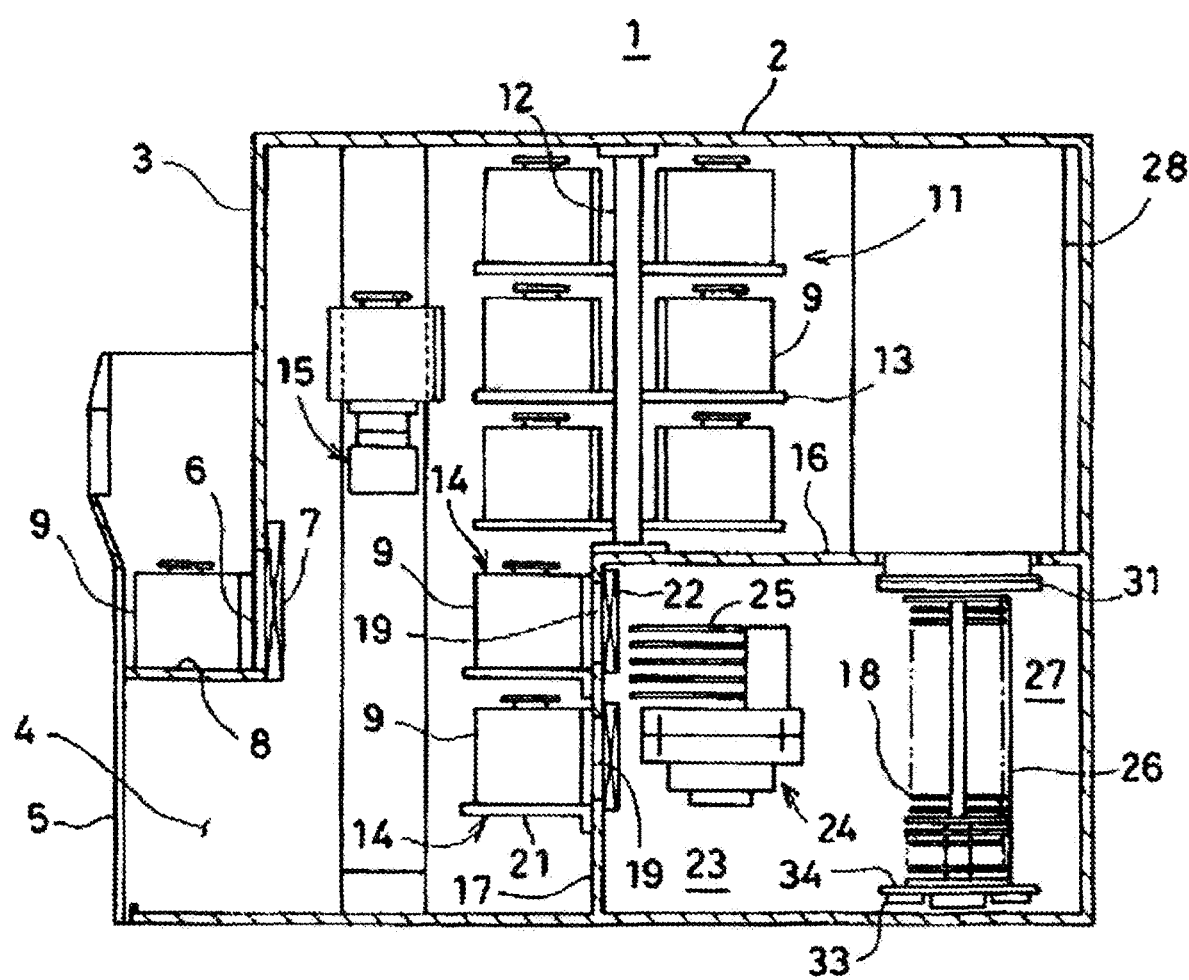
FIG. 2 is a side sectional view illustrating the substrate processing apparatus according to the present disclosure.

FIGS. 1 and 2 illustrate a vertical substrate processing apparatus as one example of a substrate processing apparatus. As one example of a substrate processed in the substrate processing apparatus, there is illustrated a semiconductor wafer composed of silicon, etc.

The substrate processing apparatus 1 includes a housing 2. A front maintenance port 4 as an opening provided so as to enable maintenance is installed in a lower portion of a front wall 3 of the housing 2. The front maintenance port 4 is opened and closed by a front maintenance door 5.

A pod loading/unloading gate 6 is installed in the front wall 3 of the housing 2 so as to bring the interior and the exterior of the housing 2 into communication with each other. The pod loading/unloading gate 6 is opened and closed by a front shutter (a loading/unloading gate opening/closing mechanism) 7. A load port (a substrate transfer container delivery stand) 8 is installed at a front side of a front surface of the pod loading/unloading gate 6. The load port 8 is configured to position-align a pod 9 mounted thereon.

The pod 9 is a sealable substrate transfer container. The pod 9 is loaded onto and unloaded from the load port 8 from above by an in-process transfer device not illustrated.

A rotary pod rack (a substrate transfer container storage rack) 11 is installed in an upper portion of a substantially central portion in a front-back direction within the housing 2. The rotary pod rack 11 is configured to store a plurality of pods 9.

The rotary pod rack 11 includes a vertically-installed and intermittently-rotated post 12 and plural stages of rack plates (substrate transfer container mounting racks) 13 radially supported on the post 12 in the respective positions of upper, middle and lower stages. Each of the rack plates 13 is configured to store a plurality of pods 9 mounted thereon.

Pod openers (substrate transfer container lid opening/closing mechanisms) 14 are installed below the rotary pod rack 11. Each of the pod openers 14 has a configuration capable of mounting the pod 9 thereon and opening or closing a lid of the pod 9.

A pod transfer mechanism (a container transfer mechanism) 15 is installed between the load port 8, the rotary pod rack 11 and the pod openers 14. The pod transfer mechanism 15 is configured to hold the pod 9 and is capable of moving up and down and moving forward and backward in a horizontal direction. The pod transfer mechanism 15 is configured to transfer the pod 9 between the load port 8, the rotary pod rack 11 and the pod openers 14.

A sub housing 16 is installed in a lower portion of the substantially central portion in the front-back direction within the housing 2 so as to extend to the rear end of the housing 2. In a front wall 17 of the sub housing 16, a pair of wafer loading/unloading gates (substrate loading/unloading gates) 19 for loading and unloading a wafer (a substrate) 18 into and out of the sub housing 16 is installed and is arranged at two upper and lower stages in a vertical direction. The pod openers 14 are installed in a corresponding relationship with the upper and lower wafer loading/unloading gates 19, respectively.

Each of the pod openers 14 includes a mounting stage 21 which mounts the pod 9 thereon and an opening/closing mechanism 22 which opens or closes the lid of the pod 9. Each of the pod openers 14 is configured such that a wafer entrance of the pod 9 is opened or closed by opening or closing the lid of the pod 9 mounted on the mounting stage 21 using the opening/closing mechanism 22.

The sub housing 16 constitutes a transfer chamber 23 air-tightly isolated from a space (a pod transfer space) in which the pod transfer mechanism 15 and the rotary pod rack 11 are arranged. A wafer transfer mechanism (a substrate transfer mechanism) 24 is installed in a front region of the transfer chamber 23. The wafer transfer mechanism 24 includes a required number of (five, in the illustrated example) wafer mounting plates 25 which mount wafers 18 thereon. The wafer mounting plates 25 are capable of linearly moving in the horizontal direction, rotating in the horizontal direction, and moving up and down. The wafer transfer mechanism 24 is configured to charge the wafers 18 to a boat (a substrate holder) 26 and to discharge the wafers 18 from the boat 26.

A standby part 27 which accommodates the boat 26 and keeps the boat 26 on standby is formed in a rear region of the transfer chamber 23. A vertical process furnace 28 is installed above the standby part 27. The process furnace 28 defines a process chamber 29 therein. A lower end portion of the process chamber 29 serves as a furnace port. The furnace port is opened or closed by a furnace port shutter (a furnace port opening/closing mechanism) 31.

A boat elevator (a substrate holder elevating mechanism) 32 for elevating the boat 26 is installed between a right end portion of the housing 2 and a right end portion of the standby part 27 of the sub housing 16. A seal cap 34 as a lid is horizontally attached to an arm 33 connected to an elevating stand of the boat elevator 32. The seal cap 34 is configured to vertically support the boat 26 and is capable of hermetically seal the furnace port in a state in which the boat 26 is loaded into the process chamber 29.

The boat 26 is configured to hold a plurality of (e.g., about 50 to 125) wafers 18 in a horizontal posture at multiple stages with the wafers 18 aligned with the center of the boat 26.

A clean unit 35 is arranged in a position which faces the boat elevator 32 side. The clean unit 35 is configured by a supply fan and a dust filter so that the clean unit 35 can supply a clean air 36 which may be a purified atmosphere or an inert gas. A notch aligning device (not illustrated) as a substrate aligning device which aligns circumferential positions of the wafers 18 is installed between the wafer transfer mechanism 24 and the clean unit 35.

The clean air 36 blown out from the clean unit 35 flows toward the notch aligning device (not illustrated), the wafer transfer mechanism 24 and the boat 26. Thereafter, the clean air 36 is drawn into a duct not illustrated and is exhausted to the outside of the housing 2. Alternatively, the clean air 36 may be blown into the transfer chamber 23 by the clean unit 35.

Next, descriptions will be made on an operation of the substrate processing apparatus 1.

If the pod 9 is supplied to the load port 8, the pod loading/unloading gate 6 is opened by the front shutter 7. The pod 9 on the load port 8 is loaded into the housing 2 through the pod loading/unloading gate 6 by the pod transfer mechanism 15 and is mounted on a designated one of the rack plates 13 of the rotary pod rack 11. The pod 9 is temporarily stored in the rotary pod rack 11. Thereafter, the pod 9 is transferred from the rack plates 13 to one of the pod openers 14 by the pod transfer mechanism 15 and is mounted on the mounting stage 21. Alternatively, the pod 9 may be directly transferred from the load port 8 to the mounting stage 21.

At this time, the wafer loading/unloading gates 19 are closed by the opening/closing mechanisms 22, and the clean air 36 is circulated through and filled in the transfer chamber 23. For example, a nitrogen gas as the clean air 36 is filled in the transfer chamber 23, whereby an oxygen concentration is set at 20 ppm or less which is far lower than an oxygen concentration of the interior of the housing 2 (atmospheric atmosphere).

An opening side end surface of the pod 9 mounted on the mounting stage 21 is pressed against an opening edge portion of the wafer loading/unloading gate 19 in the front wall 17 of the sub housing 16. The lid of the pod 9 is removed by the opening/closing mechanism 22, whereby the wafer entrance is opened.

If the pod 9 is opened by the pod opener 14, the wafer 18 is taken out from the pod 9 by the wafer transfer mechanism 24 and is transferred to the notch aligning device (not illustrated). After the wafer 18 is aligned by the notch aligning device, the wafer transfer mechanism 24 loads the wafer 18 into the standby part 27 existing in the rear region of the transfer chamber 23 and charges the wafer 18 to the boat 26.

The wafer transfer mechanism 24 which has delivered the wafer 18 to the boat 26 is returned to the pod 9 to charge the next wafer 18 to the boat 26.

During the time when the work of charging the wafer 18 to the boat 26 by the wafer transfer mechanism 24 is performed in one (upper or lower) pod opener 14, another pod 9 is transferred from the rotary pod rack 11 to the other (lower or upper) pod opener 14 by the pod transfer mechanism 15, and a work of opening the pod 9 is simultaneously performed by the other pod opener 14.

If a pre-designated number of wafers 18 are charged to the boat 26, the furnace port of the process furnace 28 closed by the furnace port shutter 31 is opened by the furnace port shutter 31. Subsequently, the boat 26 is moved up by the boat elevator 32 and is loaded into the process chamber 29.

After loading the boat 26, the furnace port is hermetically sealed by the seal cap 34. In the present embodiment, at this timing (after loading the boat 26), a purge step (a pre-purge step) in which the process chamber 29 is substituted with an inert gas is performed.

The process chamber 29 is vacuum-evacuated by a gas exhaust mechanism (not illustrated) so that an internal pressure of the process chamber 29 becomes a desired pressure (vacuum degree). Furthermore, the process chamber 29 is heated to a predetermined temperature by a heater drive part (not illustrated) so that the process chamber 29 has a desired temperature distribution.

Moreover, a process gas controlled at a predetermined flow rate is supplied by a gas supply mechanism (not illustrated). In the course of the process gas flowing through the process chamber 29, the process gas makes contact with the surfaces of the wafers 18, whereby a predetermined process is performed on the surfaces of the wafers 18. In addition, the reacted process gas is exhausted from the process chamber 29 by the gas exhaust mechanism.

If a predetermined process time is elapsed, an inert gas is supplied from an inert gas supply source (not illustrated) into the process chamber 29 by the gas supply mechanism. The process chamber 29 is substituted with the inert gas and the internal pressure of the process chamber 29 is returned to an atmospheric pressure (post-purge step). Then, the boat 26 is moved down by the boat elevator 32 with the seal cap 34 interposed therebetween.

When unloading the wafers 18 processed as above, the wafers 18 and the pod 9 are discharged to the outside of the housing 2 in an order opposite to the order described above. Unprocessed wafers 18 are charged to the boat 26 again and the batch process of the wafers 18 is repeated.

Figure 3:
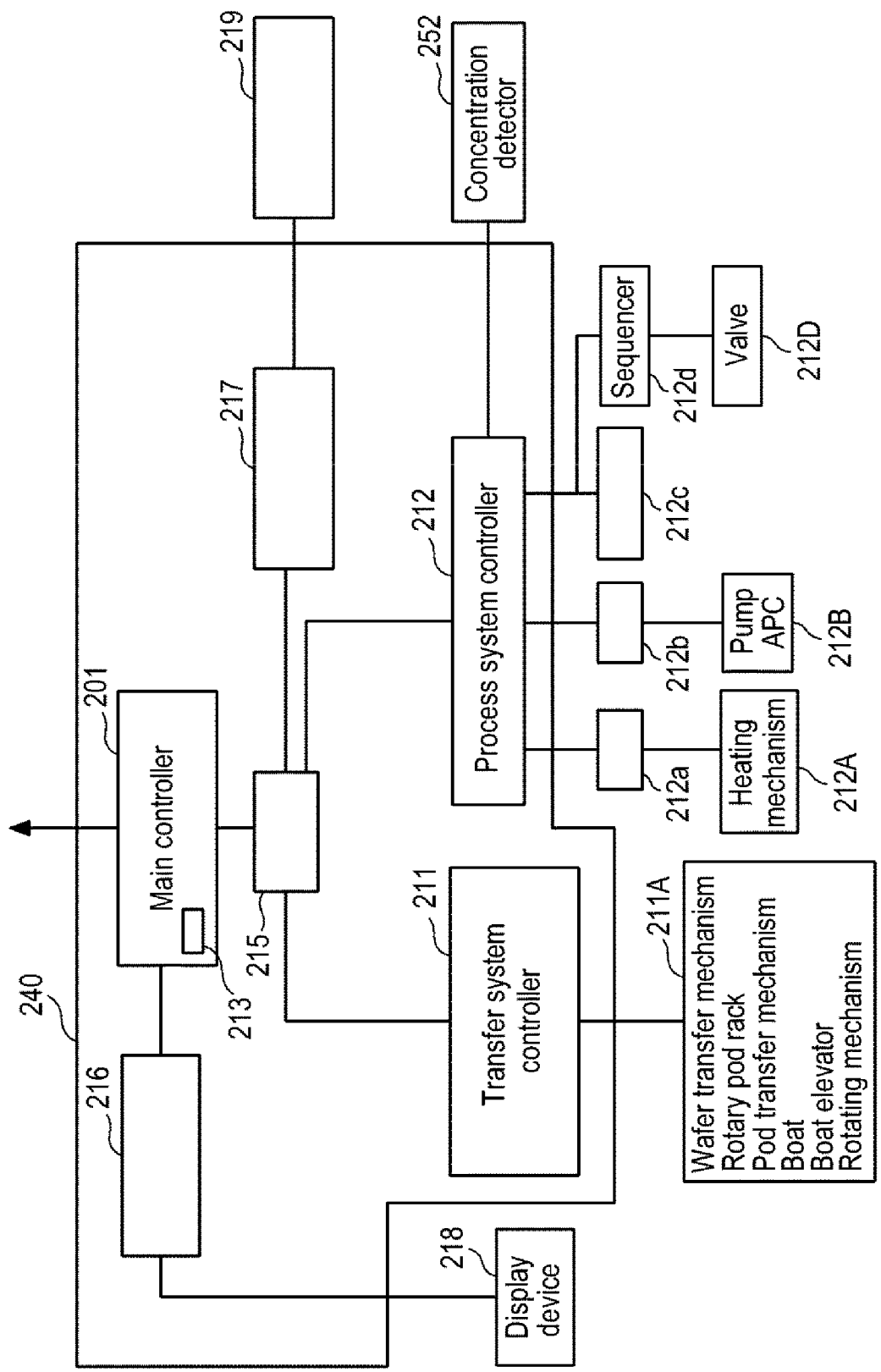
FIG. 3 is a view illustrating a configuration of a device controller of the substrate processing apparatus according to the present disclosure.

Descriptions will be made with reference to FIGS. 3 and 4 on the process furnace 28; transfer mechanisms including at least the pod transfer mechanism 15, the wafer transfer mechanism 24 and the boat elevator 32 which are mechanisms for transferring substrates; a gas supply mechanism for supplying a processing gas or the like to the process furnace 28; a gas exhaust mechanism for evacuating the interior of the process furnace 28; a heater drive part for heating the process furnace 28 to a predetermined temperature; and a control device 240 for controlling the process furnace 28, the transfer mechanisms, the gas supply mechanism, the gas exhaust mechanism and the heater drive part.

Next, referring to FIG. 3, descriptions will be made on a configuration of a control device 240 centered on a main controller 201 as a main control part. As illustrated in FIG. 3, a device controller 240 as a control device includes a main controller 201, a switching hub 215 connected to the main controller 201, a display controller 216 connected to the main controller 201, an auxiliary display controller 217 as an auxiliary display part connected to the main controller 201 via the switching hub 215, a transfer system controller 211 as a transfer control part, and a process system controller 212 as a process control part. The transfer system controller 211 and the process system controller 212 are electrically connected to the main controller 201 via the switching hub 215 by a LAN (Local Area Network) such as, e.g., 100BASE-T.

In the main controller 201, there is provided a port 213 as a mounting portion into which a USB memory or the like, which is a recording medium as an external memory device, is removably inserted. An OS corresponding to the port 213 is installed in the main controller 201. Furthermore, the main controller 201 is connected to an external high-level computer (not illustrated) via, e.g., a communication network. Thus, even when the substrate processing apparatus 1 is installed within a clean room, the high-level computer may be disposed in an office and the like located outside the clean room.

The display controller 216 is connected to a display device 218 as a display part by, e.g., a video cable. The display device 218 is, e.g., a liquid crystal display panel. The display device 218 is configured to display individual operation screens for operating the substrate processing apparatus 1. The display device 218 includes a screen for confirming the states of a substrate transfer system 211A and a substrate processing system. Furthermore, individual operation buttons (also referred to as system command buttons or PM command buttons) as an input part for inputting operation instructions to the substrate transfer system 211A and the substrate processing system (a heating mechanism 212A, a gas exhaust mechanism 212B and a gas supply system 212C) may be provided on the operation screens. The display controller 216 allows the display device 218 to display the information generated within the substrate processing apparatus 100 through an operation screen. Furthermore, the display controller 216 allows the information displayed on the display device 218 to be output to a device such as a USB memory or the like inserted into the main controller 201. The display controller 216 receives input data (input instructions) input by a worker through an operation screen displayed on the display device 218, and transmits the input data to the main controller 201. Furthermore, the display controller 216 receives instructions (control instructions) which execute a recipe expanded in a below-mentioned memory (a RAM) or the like or an arbitrary substrate processing recipe (also referred to as a process recipe) among a plurality of recipes stored in a below-described storage part, and transmits the instructions to the main controller 201. The display controller 216, the input part and the display device 218 may be configured by a touch panel. The auxiliary display controller 217 and an auxiliary display device 219 have the same configuration as the display controller 216 and the display device 218. While the display controller 216 and the auxiliary display controller 217 are described as being independent of the main controller 201, they may be included in the main controller 201. Hereinafter, there may be a case where a configuration including at least the main controller 201, the display controller 216 and the display device 218 is referred to as an operation part and a case where a configuration including at least the main controller 201, the auxiliary display controller 217 and the auxiliary display device 219 is referred to as an auxiliary operation part.

The transfer system controller 211 is connected to the substrate transfer system 211A which is mainly configured by the rotary pod rack 11, the boat elevator 32, the pod transfer mechanism (the substrate transfer container transfer device) 15, the wafer transfer mechanism (the substrate transfer mechanism) 24, the boat 26, and a rotating mechanism (not illustrated). The transfer system controller 211 is configured to control the transfer operations of the rotary pod rack 11, the boat elevator 32, the pod transfer mechanism (the substrate transfer container transfer device) 15, the wafer transfer mechanism (the substrate transfer mechanism) 24, the boat 26, and the rotating mechanism (not illustrated).

The process system controller 212 includes a temperature controller 212a, a pressure controller 212b, a gas supply flow rate controller 212c, a sequencer 212d and a concentration detector 252. The temperature controller 212a, the pressure controller 212b, the gas supply flow rate controller 212c, the sequencer 212d and the concentration detector 252 constitute a sub controller and are electrically connected to the process system controller 212. This enables transmission and reception of data, download of files, upload of files, etc. While the process system controller 212 and the sub controller are illustrated as being independent of each other, they may be configured as a single unit.

A heating mechanism 212A mainly configured by a heater and a temperature sensor is connected to the temperature controller 212a. The temperature controller 212a is configured to control the temperature of a heater for the process furnace 28, thereby adjusting the internal temperature of the process furnace 28. Furthermore, the temperature controller 212a is configured to perform a switching control of a thyristor, consequently controlling the electric power supplied to a heater wire.

A pressure sensor and a gas exhaust mechanism 212B, which is configured by an APC (Automatic Pressure Controller) valve as a pressure valve and a vacuum pump, are connected to the pressure controller 212b. The pressure controller 212b is configured to control an opening degree of the APC valve and a switching (on/off) operation of the vacuum pump based on a pressure value detected by the pressure sensor, so that the internal pressure of the process chamber 29 becomes a desired pressure at a desired timing.

The gas supply flow rate controller 212c is configured by an MFC (Mass Flow Controller). The sequencer 212d is configured to control the supply of a gas from a process gas supply pipe or a purge gas supply pipe and the stop of the gas by opening or closing a valve 212D. Furthermore, the process system controller 212 is configured to control the gas supply flow rate controller 212c (the MFC) and the sequencer 212d (the valve 212D) so that the flow rate of the gas supplied into the process chamber 29 becomes a desired flow rate at a desired timing.

The concentration detector 252 is configured to detect a concentration of a reaction gas generated during gas cleaning. The process system controller 212 is configured to acquire a signal detected by the concentration detector 252 and to perform cleaning completion determination based on a behavior of a gas concentration obtained from the acquired signal. In this regard, the concentration detector 252 is a concentration detector capable of detecting a predetermined gas from an exhaust gas using, e.g., a Non-Dispersive Infrared (NDIR) spectrometer or a Fourier Transform Infrared (FTIR) spectroscope. In the embodiment of the present disclosure, the predetermined gas is silicon tetrafluoride ($SiF_4$).

Furthermore, the main controller 201, the transfer system controller 211 and the process system controller 212 according to the embodiment of the present disclosure can be realized using an ordinary computer system without resort to a dedicated system. For example, the respective controllers for executing a predetermined process can be configured by installing a program on a large-scale machine (a supercomputer) from a recording medium (a flexible disk, a CD-ROM, a USB, etc.) which stores a program for executing the aforementioned process.

A means for supplying the program is arbitrary. Instead of supplying the program via a predetermined recording medium in the aforementioned manner, it may be possible to supply the program via, e.g., a communication line, a communication network, a communication system, etc. In this case, for example, the program may be posted on a bulletin board of a communication network and may be provided via a network by superimposing the program on a carrier. Then, the program thus provided is started up and is executed similar to other application programs under the control of an OS. This makes it possible to implement a predetermined process.

Next, the block configuration of the main controller 201 will be described with reference to FIG. 4. FIG. 4 is a block configuration view of the main controller 201 provided in the device controller 240 as a control device of the substrate processing apparatus 100 according to a first embodiment of the present disclosure.

The main controller 201 as a main control part is configured as a computer which includes a CPU (Central Processing Unit) 224 as a processing part, a memory (a RAM, a ROM, etc.) 226 as a temporary memory part, a hard disk (HDD) 222 as a memory part, a transceiver module 228 as a communication part, and a time part (not illustrated) having a clock function.

In the hard disk 222, there are stored individual recipe files of a recipe which defines processing conditions and processing procedures, a control program file for executing these recipe files, a parameter file for setting processing conditions and processing procedures, an error processing program file, an error processing parameter file, various types of screen files, and various types of icon files (all of which are not illustrated). The display controller 216, the switching hub 215 and the like are connected to the transceiver module 228 of the main controller 201. The main controller 201 is configured to transmit and receive data to and from an external computer and the like via a network.

Figure 4:
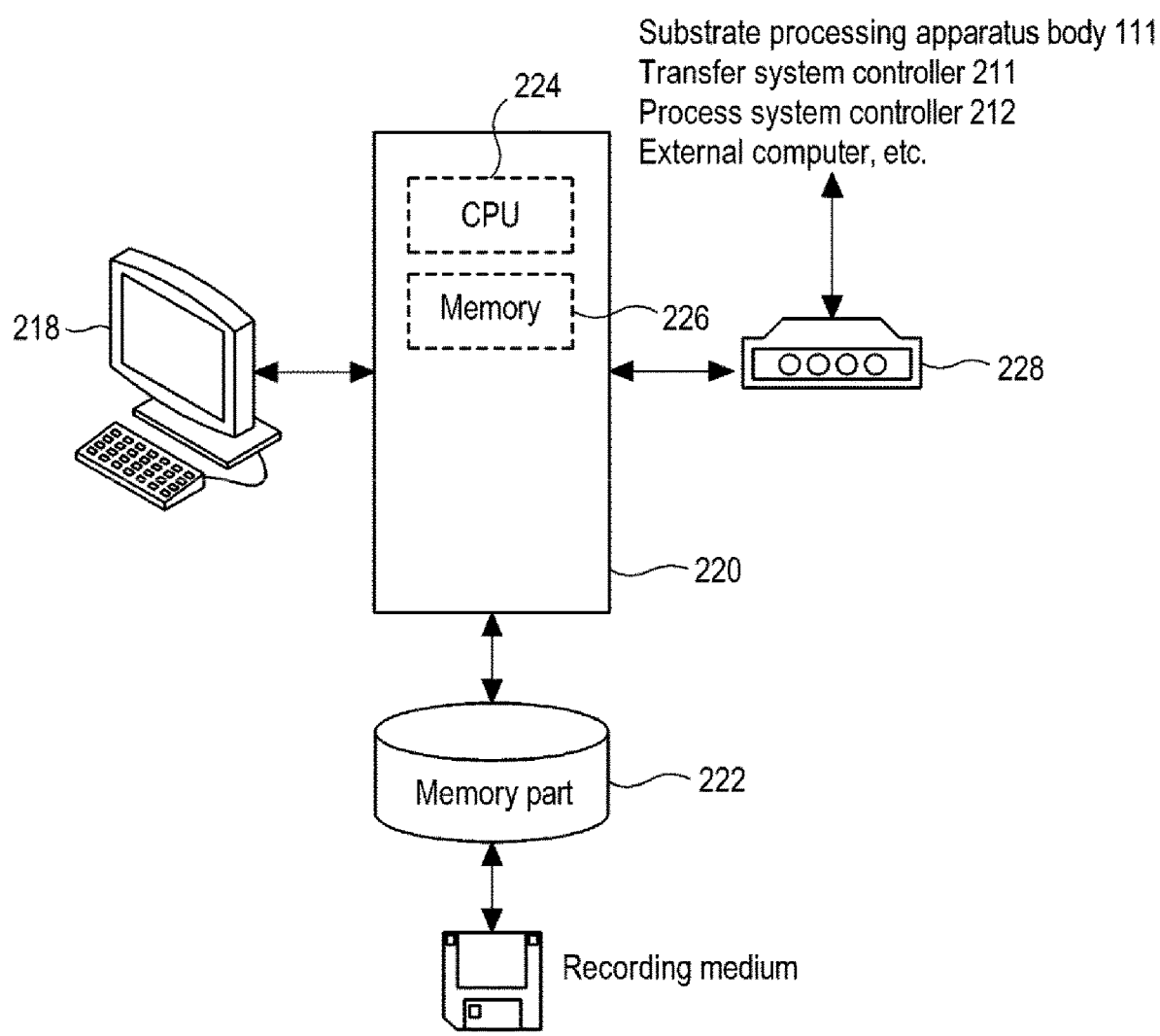
FIG. 4 is a block diagram illustrating a configuration of a main controller of the substrate processing apparatus according to the present disclosure.

As illustrated in FIG. 4, the main controller 201 may be configured to include: a control part 220 including at least the CPU 224 and the memory 226; a communication part 228 which transmits and receives data to and from an external computer and the like via a network; and a memory part 222 such as a hard disk drive or the like. The main controller 201 may further include a user interface (UI) device 218 including a display device such as a liquid crystal display or the like, a keyboard and a pointing device such as a mouse or the like. Moreover, the control part 220 may be configured to further include the communication part 228.

Furthermore, the main controller 201 transmits the state of a substrate processing apparatus body 111 and the like to an external host device or the like via a network not illustrated. The substrate processing apparatus body 111 is a vertical device which performs, for example, an oxidizing process, a diffusing process and a CVD process with respect to a substrate. Moreover, the substrate processing apparatus body 111 is controlled by the device controller 240 based on, e.g., an operation recipe, a control parameter and the like stored in the memory part 222.

Figure 5:
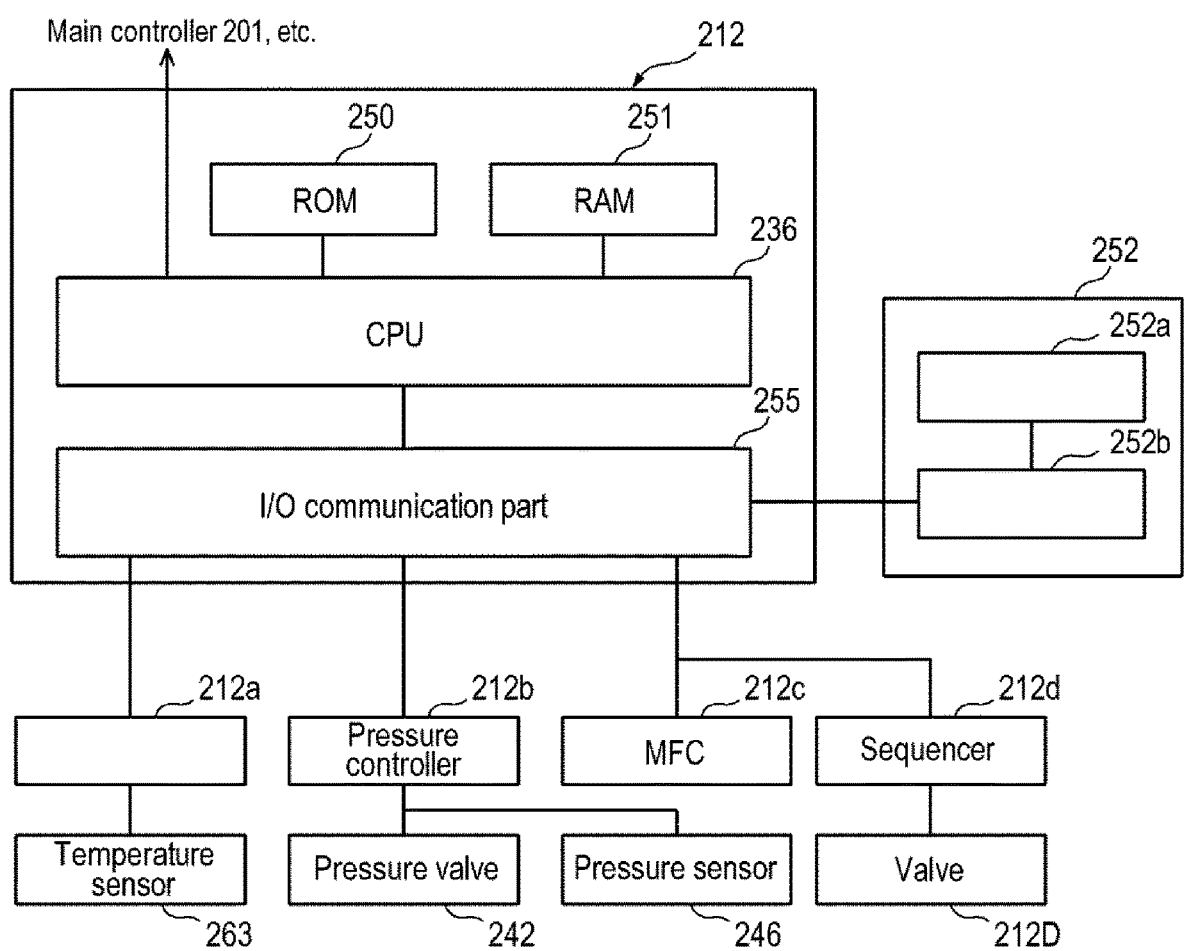
FIG. 5 is a view illustrating a configuration of a process system controller of the substrate processing apparatus according to the present disclosure.

Details of the process system controller 212 are illustrated in FIG. 5. Although not illustrated, the transfer system controller 211 also has a similar configuration.

As illustrated in FIG. 5, the process system controller 212 includes at least a CPU 236 as a processing part, a temporary memory part including at least a ROM (Read Only Memory) 250 and a RAM (Random Access Memory) 251, and an I/O communication part 255 which performs I/O communication with the temperature controller 212*a*, the MFC 212*c*, the pressure controller 212*b*, the sequencer 212*d*, the concentration detector 252 and the like. The CPU 236 outputs, for example, control data (control instructions) for processing a substrate, to the temperature controller 212*a* or the like, based on a recipe prepared or edited using an operation screen or the like of the display device 218 and stored in the RAM 251 or the like.

In the ROM 250 or the RAM 251, there are stored a sequence program, a plurality of recipes, input data (input instructions) input from the display device 218 as an operation part or the like, recipe commands, history data during execution of recipes, etc. In this way, the ROM 250 or the RAM 251 is used as a memory part for storing a recipe in which substrate processing procedures are written. The input instructions are issued from an operation screen displayed on the display device 218, an auxiliary operation screen displayed on the auxiliary display device 219, or an operation screen displayed on an external display device. Examples of the input instructions may include, in addition to an instruction for executing a recipe, an instruction for setting an operation authority of each user. However, the input instructions are not limited thereto. A memory part (not illustrated) realized by a hard disk drive (HDD) or the like may be included in the process system controller 212. In this case, the same data as the data stored in the RAM 251 may be stored in the memory part.

The temperature controller 212*a* controls the internal temperature of the process furnace 28 using a heater installed in an outer periphery portion of the aforementioned process furnace 28. The MFC (Mass Flow Controller) 212*c* as a gas control part is installed in a gas pipe of the process furnace 28 to control a supply amount of a reaction gas or the like supplied into the process furnace 28. The sequencer 212*d* controls the supply and stop of a predetermined gas by opening or closing the valve 212D installed in a process gas supply pipe or a purge gas supply pipe. Furthermore, the process system controller 212 is configured to control the gas supply flow rate controller 212*c* (the MFC) and the sequencer 212*d* (the valve 212D) so that the flow rate of a gas supplied into process chamber 29 becomes a desired flow rate at a desired timing. In the meantime, the pressure controller 212*b* controls the internal pressure of the process furnace 28 by controlling the opening degree of an APC valve 242 based on an output value of a pressure sensor 246 installed in an exhaust pipe of the process furnace 28.

In the present embodiment, the concentration detector 252 is configured by at least an NDIR 252*a* as an infrared sensor which detects a predetermined reaction gas when executing the cleaning of the interior of the process furnace 28 and a control part 252*b* which detects a signal transmitted from the NDIR 252*a*.

The concentration detector 252 allows the NDIR 252*a* as an infrared sensor to measure a concentration of a predetermined gas generated when cleaning the interior of the process furnace 28 by executing a cleaning recipe among maintenance-purpose recipes, and allows the control part 252*b* to detect a signal from the gas concentration thus measured. The control part 252*b* transmits the detected signal as a cleaning completion determination signal to the process system controller 212. The process system controller 212 is configured to perform cleaning completion determination based on the behavior of the determination signal. It goes without saying that the NDIR 252*a* and the control part 252*b* may have an integrated structure. Hereinafter, in the present embodiment, there may be a case where the concentration detector 252 is simply referred to as an NDIR 252.

In the substrate processing apparatus 1 according to the present embodiment, an operation authority of a user (a worker) is set for every type of file. For example, descriptions will be made on a process recipe among a variety of recipe files. In the case where an operation authority with respect to the process recipe is set editable, a registered user is capable of referring to and editing the process recipe (file). With respect to the sub recipes and the maintenance-purpose recipes, an operation authority of a user (a worker) on the respective recipe files is similarly set. In this regard, a user registered to have an editing authority is capable of, on an operation screen, referring to and editing the data on the sub recipes and the maintenance-purpose recipes.

For example, if a process recipe is prepared or edited and preserved by a user's operation on the operation screen of the display device 218 as a display part, the process recipe is transmitted to a transmission and reception processing part (not illustrated) of the process system controller 212 via the switching hub 215 and is stored in the ROM 250. Alternatively, the process recipe may be stored in the memory part 222. In this case, the respective files including the process recipe may be stored in the memory part 222. Needless to say, it may be possible to store the same data as the data stored in the ROM 250 and the RAM 251.

If the data for setting a recipe or the data (input data) on an operation authority of a user (a worker) with respect to the recipe are input from an input part via the operation screen of the display device 218, the input data (the input instructions) are stored in the memory 226 as a temporary memory part and are displayed on the operation screen via the display controller 216. Furthermore, the input data (the input instructions) are transmitted to the transmission and reception processing part of the process system controller 212 via the switching hub 215.

The CPU 236 stores the input data in the RAM 251 and finalizes the setting input of the recipe stored in, e.g., the ROM 251 or the operation authority of the user (the worker) with respect to the recipe. Furthermore, the CPU 236 starts up a control program and calls out and executes the commands of the recipe stored in, e.g., the RAM 251, according to the control program. Thus, steps are performed sequentially. Control instructions for processing a substrate are transmitted to the temperature controller 212*a*, the gas supply flow rate controller 212*c* and the pressure controller 212*b* via the I/O communication part 255.

As described above, the sub controllers such as the temperature controller 212*a* and the like perform the control of the respective components (the heater, the temperature sensor 263, the pressure valve 242, the pressure sensor 246, the valve 212D, etc.) of the substrate processing apparatus 1 based on the control instructions transmitted from the process system controller 212. Thus, the processing of the aforementioned wafer 18 is performed.

In the substrate processing apparatus 1 according to the present embodiment, similar to the process recipe, a cleaning recipe among the maintenance-purpose recipes is executed according to the control program. During the execution of the cleaning recipe, a sub recipe is called out and executed by a predetermined command. Descriptions will be made later on the setting of the cleaning recipe and the sub recipe on the operation screen.

(Substrate Processing Method)

First, descriptions will be made on a substrate processing method which is implemented using the substrate processing apparatus 1 according to the present embodiment. Taken as an example herein is a case where a substrate processing process as one example of a manufacturing process of a semiconductor device is carried out.

When carrying out the substrate processing process, a substrate processing recipe (a process recipe) corresponding to the substrate processing to be carried out is first read out from, e.g., the ROM 250 as a temporary memory part, and is expanded in the memory, such as the RAM 251 or the like, existing within the main controller 201. Then, if necessary, the main controller 201 transmits operation instructions to the process system controller 212 or the transfer system controller 211. The substrate processing process to be carried out in this way largely includes a transfer process, a loading process, a film forming process, a boat transfer process and an unloading process.

(Transfer Process)

A drive instruction of the wafer transfer mechanism 24 is issued from a main controller 201 to a transfer system controller 110. Then, according to the instruction transmitted from the transfer system controller 110, the wafer transfer mechanism 24 starts a process in which the wafer 18 is transferred from the pod 9 on the delivery stage 21 as a mounting stage to the boat 26. This transfer process is performed until charging of all the scheduled wafers 18 to the boat 26 (wafer charging) is completed.

(Loading Process)

If a designated number of wafers 18 are charged to the boat 26, the boat 26 is moved up by the boat elevator 32 which operates pursuant to the instruction transmitted from the transfer system controller 110 and is loaded into the process chamber 29 formed within an inner tube of the process furnace 28. If the boat 26 is completely loaded, the seal cap 34 of the boat elevator 32 hermetically seals the lower end of a manifold of the process furnace 28.

(Film Forming Process)

Thereafter, the interior of the process chamber 29 is vacuum-evacuated by an evacuation device pursuant to the instruction transmitted from the pressure controller 212b so that the internal pressure of the process chamber 29 becomes a predetermined film forming pressure (vacuum degree). At this time, the internal pressure of the process chamber 29 is measured by the pressure sensor 246. A pressure regulating device is feedback controlled according to the pressure information thus measured. Furthermore, the interior of the process chamber 29 is heated by the heater pursuant to the instruction transmitted from the temperature controller 212a so that the internal temperature of the process chamber 29 becomes a predetermined temperature. At this time, the power supply to the heater is feedback controlled according to the temperature information detected by the temperature sensor 263 as a temperature detector so that the internal temperature of the process chamber 29 becomes a predetermined temperature (film forming temperature). Subsequently, the boat 26 and the wafers 18 begin to be rotated by the rotating mechanism pursuant to the instruction transmitted from the transfer system controller 211.

For example, while keeping the interior of the process chamber 29 at a predetermined film forming temperature and a predetermined film forming pressure, the supply of a silicon-containing gas into the process chamber 29 is started. At this time, an $N_2$ gas supplied into the process chamber 29 serves as a dilution gas which dilutes a film forming gas (e.g., a $SiH_2Cl_2$ gas), or a carrier gas which promotes diffusion of the film forming gas into the process chamber 29. By controlling a supply flow rate of the $N_2$ gas, it is possible to control a concentration or a diffusion speed of the film forming gas (a $SiH_2Cl_2$ gas).

The film forming gas ($SiH_2Cl_2$ gas) supplied into the process chamber 29 makes contact with the surfaces of the wafers 18 when passing through the interior of the process chamber 29. At this time, a thin film, namely a silicon film (hereinafter simply referred to as a Si film), is deposited on each of the surfaces of the wafers 18. If a predetermined processing time is elapsed and if a silicon film having a predetermined film thickness is formed, the valve is closed and the supply of the film forming gas (the $SiH_2Cl_2$ gas) into the process chamber 29 is stopped.

Then, while continuously supplying the $N_2$ gas into the process chamber 29, the interior of the process chamber 29 is evacuated to thereby purge the interior of the process chamber 29. If the internal atmosphere of the process chamber 29 is substituted with the $N_2$ gas, the internal pressure of the process chamber 29 is returned to an atmospheric pressure by adjusting the opening degree of the pressure valve 242 as a pressure regulating part. Moreover, the power supply to the heater is stopped and the internal temperature of the process chamber 29 is lowered to a predetermined temperature (a wafer unloading temperature). The pressure valve 242 may be an APC valve.

(Unloading Process)

If the film forming process with respect to the boat 26 is completed, the rotation of the boat 26 and the wafers 18 performed by the rotating mechanism is then stopped pursuant to the instruction transmitted from the transfer system controller 211. The lower end of the manifold is opened by moving the seal cap 34 down using the boat elevator 32. The boat 26 which holds processed wafers 18 is unloaded to the outside of the process chamber 29.

Then, the boat 26 which holds processed wafers 18 is extremely effectively cooled by the clean air 36 blown out from the clean unit 35. Then, if the boat 26 is cooled to, e.g., 150 degrees C., the processed wafers 18 are discharged from the boat 26 and are transferred to the pod 9. Thereafter, new unprocessed wafers 18 are charged to the boat 26.

By repeating the respective processes described above, the substrate processing apparatus 1 according to the present embodiment can form silicon films on the wafers 18 with high throughput.

While the dichlorosilane ($SiH_2Cl_2$) gas is illustrated as an example of the silicon-containing gas, the present disclosure is not limited to this. It may be possible to use, for example, other chlorosilane-based precursors such as monochlorosilane ($SiH_3Cl$, abbreviation: MCS), hexachlorodisilane ($Si_2Cl_6$, abbreviation: HCDS), tetrachlorosilane ($SiCl_4$, abbreviation: STC), trichlorosilane ($SiHCl_3$, abbreviation: TCS) and the like, inorganic precursors such as trisilane ($Si_3H_8$, abbreviation: TS), disilane ($Si_2H_6$, abbreviation: DS), monosilane ($SiH_4$, abbreviation: MS) and the like, and organic precursors such as aminosilane-based tetrakisdimethylaminosilane ($Si[N(CH_3)_2]_4$, abbreviation: 4DMAS), trisdimethylaminosilane (Si[N(CH$_3$)$_2$]$_3$H, abbreviation: 3DMAS), bisdiethylaminosilane (Si[N(C$_2$H$_5$)$_2$]$_2$H$_2$, abbreviation: 2DEAS), bis-tertiary butylaminosilane (SiH$_2$[NH (C$_4$H$_9$)]$_2$, abbreviation: BTBAS) and the like.

(Maintenance Method of Substrate Processing Apparatus)

The film forming process described above is performed for the purpose of forming films on the wafers 18. However, in reality, films are also formed on the components other than the wafers 18, for example, the reaction tube constituting the process chamber 29 and the boat 26. If the films are deposited thick, stresses acting on the films increase and cracks are generated. This may sometimes generate foreign substances (particles) within the process chamber 29. Thus, if the thickness of the films deposited within the process chamber 29 reaches a predetermined thickness as a result of repetition of the aforementioned film forming process, the substrate processing apparatus 1 according to the present embodiment carries out a below-described cleaning process as a maintenance process for maintaining the interior of the process chamber 29, etc.

(Cleaning Process)

The cleaning process is started at a time point when the thickness of a deposit (an accumulated thin film) adhering to the interior of the process chamber 29 reaches a predetermined thickness before peeling and falling of the deposit are generated. Determination as to whether a cumulative film thickness has reached a predetermined thickness may be made, for example, based on a cumulative film thickness value of a film accumulated within the process chamber 29 defined by a process tube as a reaction tube, e.g., a film thickness estimation value estimated from the use frequency or the use time of the process chamber 29 for the film forming process.

That is to say, the main controller 201 determines whether now is the maintenance time, by comparing at least one setting parameter, which is selected from the cumulative film thickness value, the use frequency and the use time of the process tube or the like, with a predetermined threshold value. If it is determined that now is the maintenance time, the process recipe under execution is normally completed as it is, but a process recipe for performing a batch process next time is not executed.

When carrying out the cleaning process, in the main controller 201, instead of the process recipe, a maintenance-purpose recipe for the cleaning to be carried out is read out from, e.g., the temporary memory part 206 and is expanded to the memory, such as the RAM or the like, existing within the main controller 201. Then, if necessary, the main controller 201 transmits an operation instruction to the process system controller 212 or the transfer system controller 211. Thus, the cleaning process is carried out.

In the case of carrying out the cleaning process, the lower end opening of the manifold is hermetically sealed by, e.g., the furnace port shutter 31. Then, the interior of the process chamber 29 is vacuum-evacuated by the evacuation device so that the internal pressure of the process chamber 29 becomes a predetermined cleaning pressure (vacuum degree). The interior of the process chamber 29 is heated by the heater so that the internal temperature of the process chamber 29 becomes a predetermined cleaning temperature. Thereafter, while keeping the interior of the process chamber 29 at the predetermined cleaning temperature and the predetermined cleaning pressure, a cleaning gas is supplied into the process chamber 29.

A F$_2$ gas supplied into the process chamber 29 moves upward within the process chamber 29 and flows out from the upper end opening of the inner tube into a tubular space. After flowing down within the tubular space, the F$_2$ gas is exhausted from the exhaust pipe. When passing through the interior of the process chamber 29, the F$_2$ gas makes contact with the silicon film or the like accumulated within the process chamber 29 and removes the silicon film or the like by virtue of a thermochemical reaction. That is to say, the thermally activated F$_2$ gas becomes etching species and etches and removes the silicon film or the like accumulated within the process chamber 29. If the removal of the silicon film or the like is finished, the supply of the F$_2$ gas into the process chamber 29 is stopped. Descriptions will be made later on the determination of finishing of the removal of the silicon film, namely the determination of cleaning completion (a cleaning completion determination process).

While the fluorine (F$_2$) gas is illustrated as one example of the cleaning gas, the present disclosure is not limited thereto. It may be possible to use, e.g., halogen-containing gases, such as a hydrogen fluoride (HF) gas, a chlorine trifluoride (ClF$_3$) gas and a nitrogen trifluoride (NF$_3$) gas, which contain halogen such as fluorine (F) or chlorine (Cl). These halogen-containing gases may be used in combination.

At this time, an N$_2$ gas may be supplied as a dilution gas which dilutes the cleaning gas (e.g., the F$_2$ gas) or as a carrier gas which promotes diffusion of the cleaning gas into the process chamber 29. By controlling a supply flow rate of the N$_2$ gas, it is possible to control a concentration or a diffusion speed of the F$_2$ gas.

Furthermore, a nitric oxide (NO) gas may be supplied as an additive gas which is added to the cleaning gas (e.g., the F$_2$ gas). Such an additive gas is used to increase the etching rate of the etching performed by the cleaning gas. In addition, an oxygen (O$_2$) gas, a hydrogen (H$_2$) gas and the like may be used as the additive gas.

(Maintenance-Purpose Recipe Execution Control)

Next, a procedure from the setting of a cleaning recipe to the execution thereof in the present embodiment will be described with reference to FIGS. 6A and 6B to 8. First, FIG. 6A is an illustrated example of a maintenance information display screen of the substrate processing apparatus according to the present embodiment. On the maintenance information display screen illustrated in FIG. 6A, item numbers, maintenance names, maintenance items, a current value, a first setting value, a second setting value, a unit and a maintenance process are respectively displayed as items.

The item numbers are composed of buttons (icons). If one of the item numbers is pushed down, the maintenance information display screen migrates to a maintenance setting screen illustrated in FIG. 6B which will be described later. The maintenance names are appropriately given. The maintenance items are configured so that a non-operation time and the like can be set in addition to a film thickness value. The first setting value is a threshold value which designates a cleaning period. If the current value reaches the first setting value, a predetermined maintenance process is performed. The second setting value is a maintenance limit value. When the current value has reached the maintenance limit value, it is determined that a recovery process (recovery to a state in which substrate processing can be performed) cannot be performed during the maintenance. In this case, the apparatus is stopped immediately.

A maintenance process performed when the current value has reached the first setting value is set as the maintenance process. If a predetermined number is selected from the item numbers (the buttons) and is pushed down, a maintenance item setting screen illustrated in FIG. 6B is popped up and displayed on the maintenance information display screen illustrated in FIG. 6A. Alternatively, the maintenance information display screen illustrated in FIG. 6A may be switched to the maintenance item setting screen illustrated in FIG. 6B. Furthermore, the maintenance item setting screen illustrated in FIG. 6B is displayed for every item number.

The maintenance item setting screen illustrated in FIG. 6B illustrates a screen available when No. 18 of the item numbers (the buttons) is pushed down on the maintenance information display screen illustrated in FIG. 6A. First, on the maintenance item setting screen illustrated in FIG. 6B, number 18 is displayed in the table number corresponding to the item number illustrated in FIG. 6A. On the maintenance item setting screen illustrated in FIG. 6B, four items, i.e., the maintenance item information, the current value information, the scheduling start value information and the maintenance limit value information, are displayed so that they can be set on the screen. On the maintenance item setting screen illustrated in FIG. 6B, the respective items are displayed in a corresponding relationship with the items displayed on the maintenance information display screen illustrated in FIG. 6A.

Specifically, the maintenance item information is configured so that the maintenance names can be arbitrarily changed. A recipe film thickness value (step designation) is set as a current maintenance item. Next, the current value information is configured so that the current value (the monitor value) can be changed.

The scheduling start value information as the first setting value is configured to enable the change of the first setting value, the change of the maintenance process when the current value (the monitor value) has reached the first setting value, and the setting of generation or non-generation of an alarm when the current value (the monitor value) has reached the first setting value. The current first setting value is 20,000 nm (20 μm). The first setting value is appropriately corrected depending on the type or use of a film. If the current value exceeds the first setting value, a predetermined maintenance-purpose recipe is executed.

The maintenance limit value information as the second setting value is configured to enable only the change of the second setting value. Furthermore, there is set the process (the maintenance process) performed when the current value has reached the second setting value. In FIG. 6B, job execution prohibition is set. For example, when the current recipe is completed, the next recipe cannot be executed.

The current second setting value is 25,000 nm (25 μm). Similar to the first setting value, the second setting value is appropriately corrected depending on the type or use of a film. If the current value exceeds the second setting value, the execution of all the recipes including the maintenance-purpose recipe is prohibited. A maintenance work such as the exchange of the boat 26 or the like is performed and the interior of the process furnace 28 is opened to the atmosphere.

Descriptions will be made on the operation performed on the maintenance item setting screen illustrated in FIG. 6B. For example, if a cell of the maintenance name of the maintenance item information (an indication of LV1-Check in the figure) is selected, the selected cell becomes valid, thereby enabling manual input. Alternatively, if the cell of the maintenance name is selected, a predetermined input screen or a predetermined selection screen may be displayed.

Then, the editing of the maintenance name is performed by directly manually inputting a predetermined maintenance name to the cell, or by selecting a maintenance name displayed in a cell on a predetermined input screen or a predetermined selection screen. Similarly, the editing of a maintenance process cell (an indication of maintenance job automatic start in the figure) and an alarm generation/non-generation cell (an indication of no alarm in the figure) of the scheduling start value information is performed.

Next, in the current value information, if a current value change (button) is pushed down, a predetermined numerical value input screen is displayed. The editing of a cell can be performed by inputting a predetermined numerical value on the numerical value input screen. Furthermore, the editing of a cell of a scheduling start value as the first setting value of the scheduling start value information (an indication of 200 in the figure) or a cell of a maintenance limit value as the second setting value of the maintenance limit value information (an indication of 250 in the figure) is also performed in a similar manner. If each cell is selected, a predetermined numerical value input screen is displayed. The editing of the cell can be performed by inputting a predetermined numerical value on the numerical value input screen.

If the editing of the maintenance item information, the current value information, the scheduling start value information and the maintenance limit value information is completed, an OK button is pushed down to establish the update and to return to the maintenance information display screen illustrated in FIG. 6A. If a cancel button is pushed down, the editing work performed on the maintenance item setting screen illustrated in FIG. 6B is discarded and the maintenance item setting screen is returned to the maintenance information display screen illustrated in FIG. 6A.

FIG. 7 is an illustrated example of a step setting screen for setting steps of a process recipe. The current value is calculated using a step time of a step designated on the step setting screen. In FIG. 7, the etching at step 2 is calculated.

FIG. 8 is an illustrated example of a recipe setting screen for setting a maintenance-purpose recipe. In this recipe setting screen, a cleaning recipe as a maintenance-purpose recipe is set to be executed at least when the current value has reached a scheduling start value as the first setting value.

If the respective setting works performed on the setting screens illustrated in FIGS. 6A and 6B to 8 are completed, a cleaning recipe is automatically executed when a predetermined current value (the cumulative film thickness value) has reached a predetermined threshold value (the first setting value). The cleaning completion determination according to the present disclosure is realized by performing the setting described with reference to FIG. 9 and the subsequent figures.

(Sub Recipe Execution Setting)

FIG. 9 is an illustrated example of a command setting screen for setting a sub recipe which executes a cleaning process. The command setting screen is configured so that the setting on a detection signal for detecting the cleaning completion determination (an indication of an end point detection item in the figure), the designation of a maintenance item used in a cleaning period and the setting of a calculation constant for automatic end point determination (an indication of command specifications in the figure), and the setting of an error process in a case of the automatic end point determination being impossible (an indication of an error process in the figure) can be performed on the command setting screen.

The item for acquiring a detection signal for the cleaning completion determination is set by the parameter type which includes control parameters such as a temperature, a gas and a pressure and preliminary parameters such as AUX (Auxiliary) and the like (an indication of an end point detection port type in the figure) and by the number which indicates a detection signal (an indication of an end point detection port in the figure). A detection signal transmitted from the concentration detector 252 which detects a concentration of a predetermined gas using an infrared sensor 252a is designated as the detection signal.

The aforementioned command specifications include a maintenance item (an indication of film thickness maintenance item No. (Number) in the figure) and a maximum cycle number calculation coefficient. In this regard, the item number and the maintenance item of the maintenance information display screen illustrated in FIG. 6A are set as the maintenance item. The cumulative film thickness value corresponding to the item number and the maintenance item (the current value of the maintenance information display screen illustrated in FIG. 6A) is used as the calculation constant.

This coefficient is used in calculating a minimum cycle number. A maximum cycle number calculation coefficient is set as another calculation constant. This coefficient is used in calculating a maximum cycle number. Next, an operation performed when the cycle number has reached a maximum cycle number (an indication of a maximum cycle number arrival time in the figure) is set as the error process in the case of the end point determination being impossible. In FIG. 9, the next substrate processing is prohibited (the next job is stopped). Descriptions will be made later on the minimum cycle number and the maximum cycle number.

FIG. 10 illustrates a sub recipe setting screen for setting the parameters of the sub recipe executed by the command set in FIG. 9. This setting screen is configured so as to set an estimated film thickness amount which can be removed by executing a cleaning process (a sub recipe) at least once.

Specifically, there is illustrated an example in which the film is removed by inputting a negative value. The film thickness value (the negative value) set at this time is used in calculating the minimum cycle number. Descriptions will be made later on the minimum cycle number. Although not illustrated, in FIG. 10, the control parameters such as a predetermined cleaning gas flow rate, a temperature, a pressure and the like are set similar to the setting performed at the respective steps of the process recipe. In the present embodiment, the sub recipe is configured so that the respective steps can be set so as to execute at least the gas cleaning (an etching process) and the gas exhaust (an exhaust process).

As an example, the gas cleaning process conditions are set such that the flow rate of a fluorine ($F_2$) gas as a cleaning gas is 2 slm, the flow rate of an additive gas is 8 slm, the flow rate of a dilution gas (an $N_2$ gas) is 1 slm, the pressure is 6,000 Pa, and the temperature is 300 degrees C. Thereafter, slow exhaust (S.P) is performed for 50 seconds at 666 Pa/S and main exhaust (M.P) is performed for 10 seconds in a fully-opened state of a valve. As illustrated in FIG. 10, the screen configuration is similar to the configuration of the respective steps of the process recipe.

Figure 11:
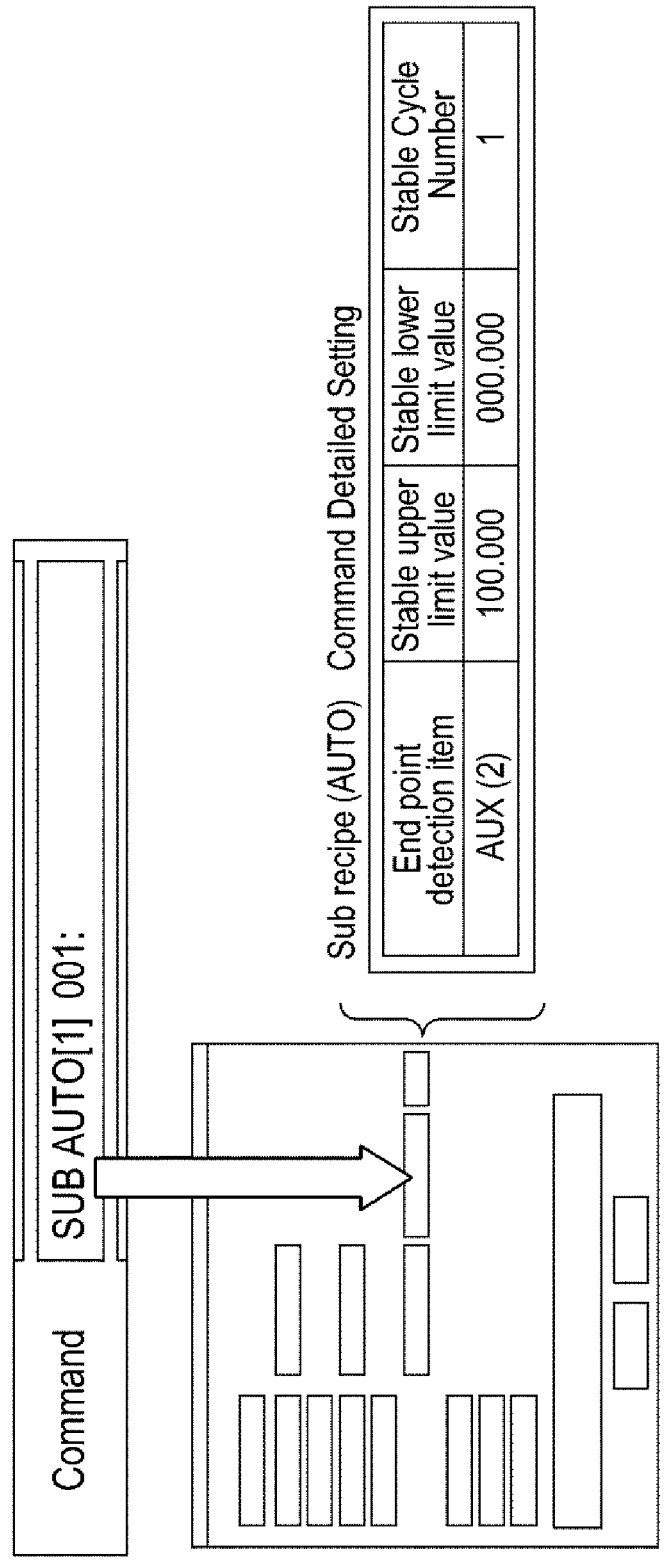
FIG. 11 is a view for explaining detailed setting of cleaning completion determination according to one embodiment of the present disclosure.

FIG. 11 is a view for explaining the designation of a cleaning completion determination signal. The cleaning completion determination is carried out by controlling the execution of the sub recipe. Therefore, in order to execute the sub recipe, a command is set in a command designation column on the recipe. If the command designation column is selected, a command selection screen is displayed. The type of display may be either switching display or pop-up screen display. Then, if a command to be used in the cleaning completion determination is selected on the command selection screen (if a sub recipe button is pushed down) and if a detail button is pushed down, there is displayed a setting screen for setting the details of the selected command.

On the setting screen, there are displayed an item for performing end point detection, a stable upper limit value, a stable lower limit value and a stable cycle number. The setting screen is configured so that the stable upper limit value, the stable lower limit value and the stable cycle number can be set. Predetermined numerical values are set as the stable upper limit value and the stable lower limit value. Basically, 0 is designated as the stable lower limit value. Furthermore, the stable cycle number is a numerical value used in calculating the maximum cycle number.

If the detailed setting on the respective setting screens illustrated in FIGS. 9 to 11 is completed as described above, it becomes possible to realize the cleaning process according to the present embodiment which can appropriately perform the cleaning completion determination. Similar to the process recipe, the main controller 201 transmits an operation instruction to the process system controller 212 or the transfer system controller 211, thereby executing the cleaning recipe.

(Sub Recipe Execution Control)

Figure 12A:
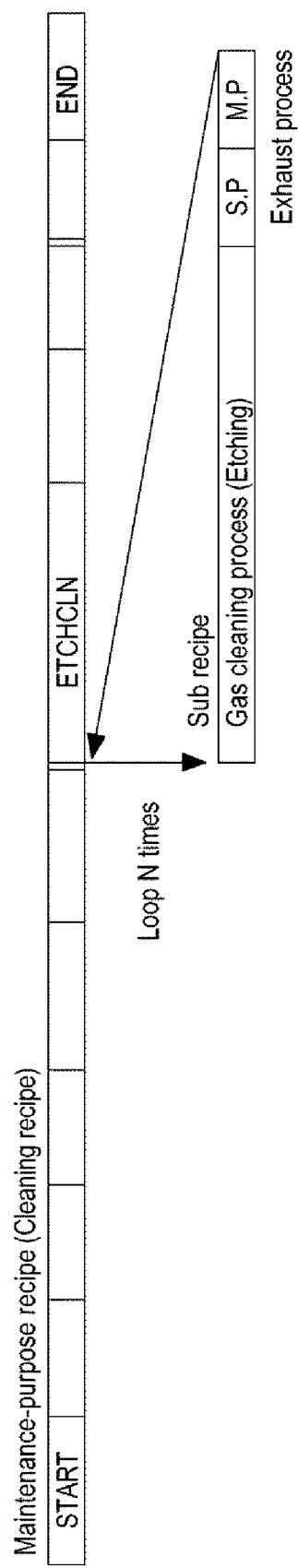
FIG. 12A is a view explaining an overview of a cleaning recipe according to the present disclosure and a flow thereof.
Figure 12B:
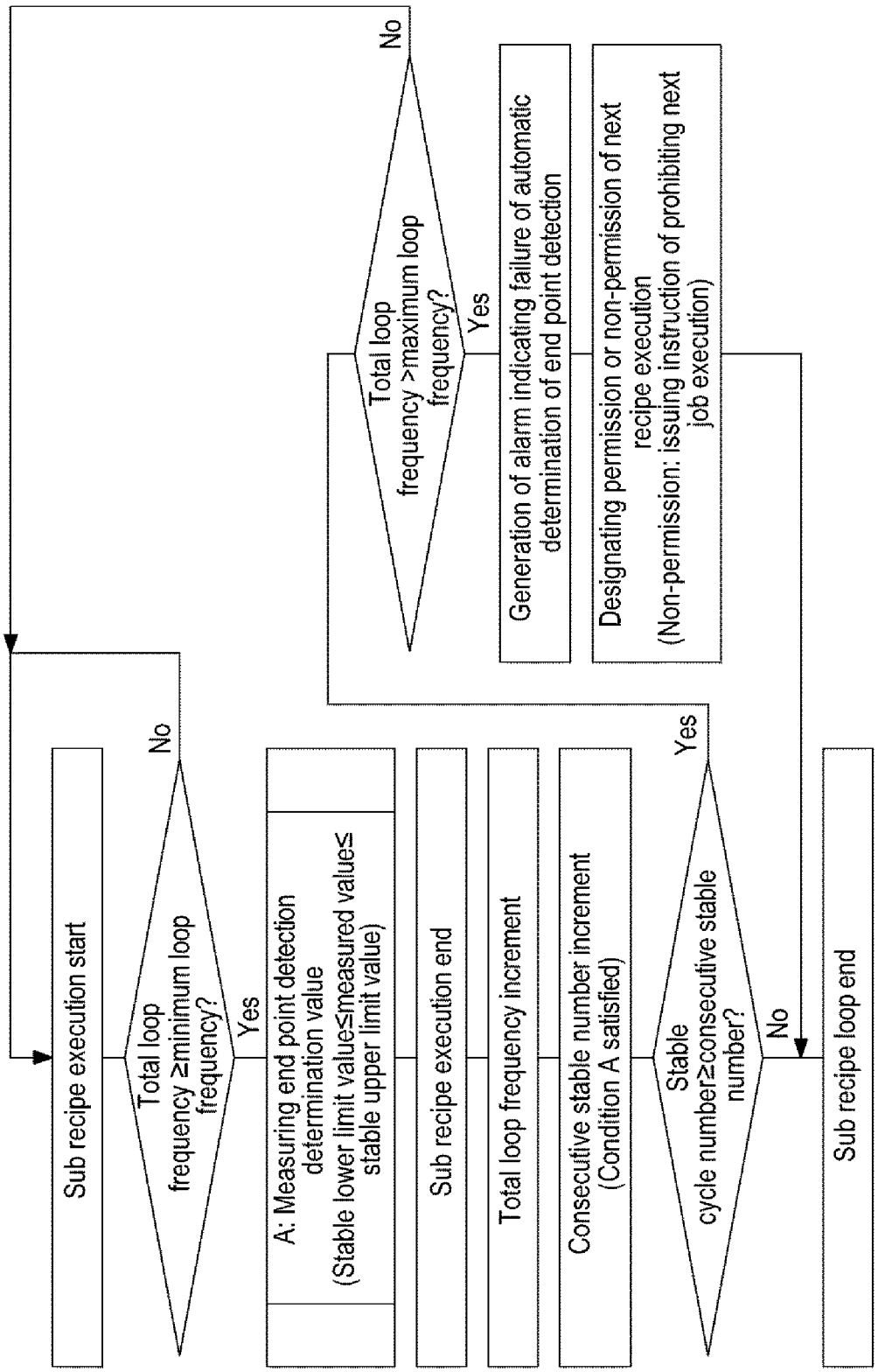
FIG. 12B is a view illustrating a flowchart of a sub recipe called out by the cleaning recipe.

Next, a flowchart for executing the cleaning recipe of the present embodiment which is executed according to the contents set on the respective screens illustrated in FIGS. 6A and 6B to 11 will be described with reference to FIGS. 12A and 12B. FIG. 12A is a view explaining an overview of the cleaning recipe according to the present embodiment and a flow thereof. FIG. 12B is a view illustrating a flowchart of the sub recipe called out by the cleaning recipe.

In the present embodiment, the cleaning process is substantially executed by the sub recipe. A process for removing a cumulative film thickness is repeatedly performed by repeatedly executing the sub recipe until the cleaning is completed. Although the cleaning recipe includes a boat loading step and a boat-down step, the present disclosure is not limited thereto, but it is only necessary that the cleaning recipe include at least a cleaning process step. In the present embodiment, a signal for end point detection determination transmitted from the concentration detector 252 can be acquired during the execution of the sub recipe to be described later. Therefore, it is preferred that the cleaning recipe includes an NDIR zero point adjustment step. However, the NDIR zero point adjustment step may be omitted, because it is only necessary to acquire the signal for end point detection determination transmitted from the concentration detector 252, for example, after the sub recipe is executed a minimum loop number of times (a minimum cycle number) as a predetermined number to be described later.

As illustrated in FIG. 12A, the cleaning recipe is configured to include at least a boat loading step, a pressure regulation step, an NDIR zero point adjustment step, a cleaning step and a boat-down step. The cleaning step is configured so as to repeatedly execute a sub recipe multiple times (N times). The sub recipe is configured to include at least a gas cleaning (etching) process and an exhaust process.

FIG. 12B illustrates the execution control flow of the sub recipe. First, at a predetermined step set by a command during the execution of the cleaning recipe, the process system controller 212 repeatedly calls out and executes the sub recipe until the execution number of the sub recipe reaches a minimum loop number (a minimum cycle number). The acquisition of a signal value for end point detection determination transmitted from the concentration detector 252 is started together with the execution the sub recipe.

If the execution number of the sub recipe reaches a minimum loop number (a minimum cycle number), it is confirmed whether the signal value for end point detection determination transmitted from the concentration detector 252 falls within a range between a predetermined stable lower limit value and a predetermined stable upper limit value, after termination of the sub recipe. In the case where the signal value for end point detection determination does not reach a predetermined threshold value (the stable upper limit value) or less, the sub recipe is executed again and the monitoring of the signal value is continuously performed. Alternatively, in the case where the signal value for end point detection determination does not reach a predetermined threshold value (the stable upper limit value) or less, the sub recipe may be returned to the cleaning recipe by regarding the situation as an error. Then the cleaning recipe may be terminated.

After it is confirmed that the signal value for end point detection determination has reached the predetermined threshold value (the stable upper limit value) or less, a consecutive stable number and an execution number (a total loop number) are calculated if the maximum value and the minimum value of the signal value fall within a range between the stable lower limit value and the stable upper limit value, during the execution of the sub recipe (during the period from the start of the sub recipe to the end thereof).

If the consecutive stable number is equal to or smaller than the stable cycle number and if the execution number of the sub recipe (the total loop number) is equal to or smaller than the maximum loop number (the maximum cycle number), the sub recipe is executed again. On the other hand, if the execution number of the sub recipe (the total loop number) exceeds the maximum loop number (the maximum cycle number), an alarm indicating the incapability of end point detection is generated and the sub recipe is terminated to return to the cleaning recipe.

If the consecutive stable number is larger than the stable cycle number and if the execution number of the sub recipe (the total loop number) is equal to or smaller than the maximum loop number (the maximum cycle number), the sub recipe is terminated to return to the cleaning recipe. On the other hand, if the execution number of the sub recipe (the total loop number) exceeds the maximum loop number (the maximum cycle number), an alarm indicating the incapability of end point detection is generated and the sub recipe is terminated to return to the cleaning recipe.

Next, when returned to the cleaning recipe, the process system controller 212 proceeds to the next step of the cleaning recipe and executes the same. Then, after executing the step, the process system controller 212 terminates the cleaning recipe.

In the case where an alarm indicating the incapability of end point detection in the sub recipe is generated, the cleaning recipe is abnormally terminated and the execution of the next recipe is not permitted. Alternatively, as illustrated in FIG. 12B, the execution of the next recipe may be arbitrarily designated.

As described above, in the present embodiment, by controlling the execution of the sub recipe when executing the cleaning recipe, it is possible to realize a function that serves as a cleaning completion determination program which cleans the components constituting the apparatus. Furthermore, by controlling the execution of the sub recipe, it is possible to control a procedure of removing a deposit adhering to the aforementioned components by supplying and exhausting a cleaning gas, and to control a signal indicating a concentration of a predetermined gas generated by the reaction of the deposit and the cleaning gas (a signal for end point detection determination in the present embodiment) so that the signal stays within a range between predetermined upper and lower limit values (the range between the stable upper limit value and the stable lower limit value in the present embodiment) for a predetermined time period after the signal reaches a predetermined threshold value (the stable upper limit value in the present embodiment).

The cleaning completion determination according to the present disclosure will be described with reference to FIG. 13. The diagram of FIG. 13 may be displayed on the operation screen of the display device 218.

Figure 13:
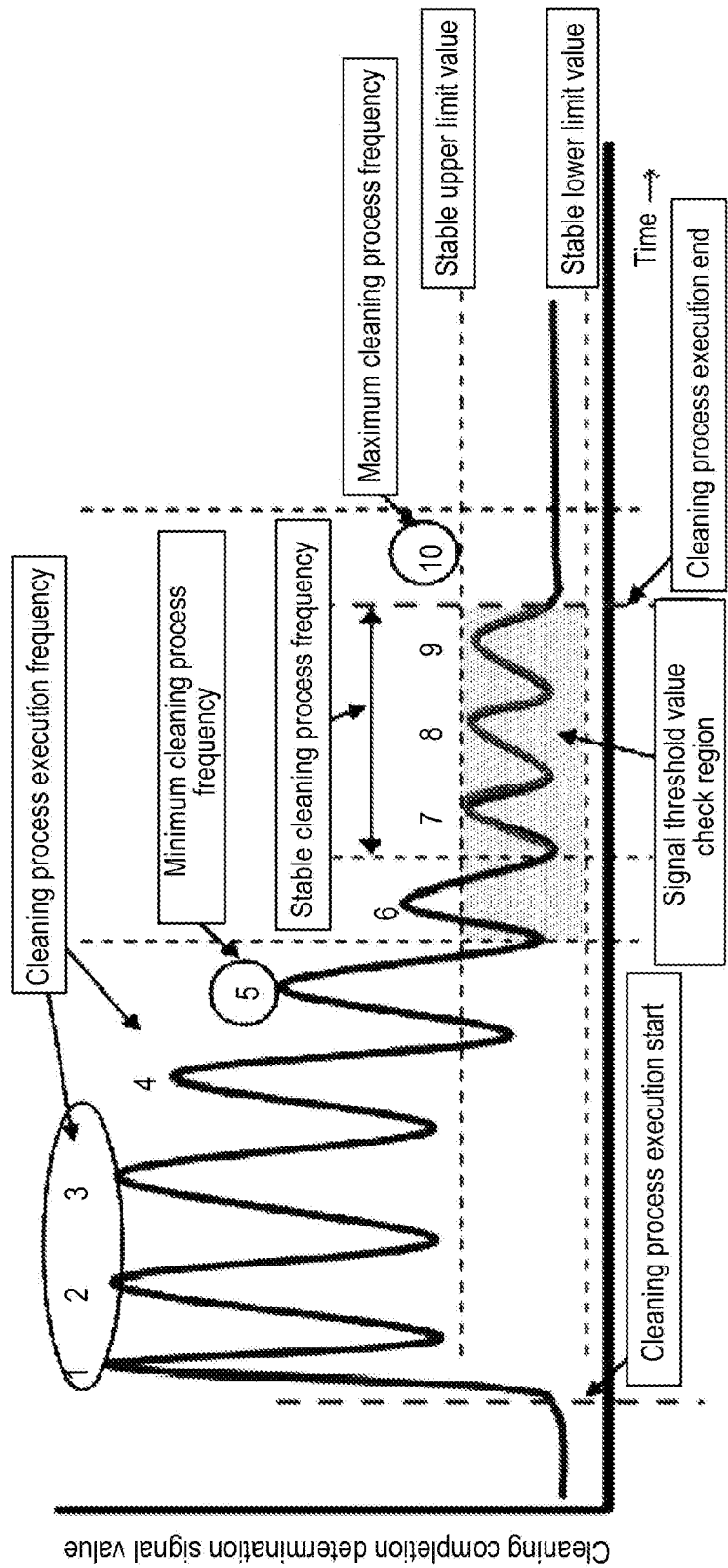
FIG. 13 is an illustrated example for explaining a behavior of a cleaning completion determination signal according to one embodiment of the present disclosure.

FIG. 13 is a time series graph illustrating a detection signal which is preset to detect cleaning completion and which is detected by the concentration detector 252. Numerical values existing on the waveform indicate the execution number of the cleaning process and substantially indicate the execution number of the sub recipe. That is to say, in the present embodiment, there is illustrated an example in which the sub recipe is executed nine times. One ridge of the waveform indicates a period spanning from the start of the sub recipe to the end thereof.

While the cleaning process execution number is indicated in FIG. 13 in order to increase the understanding, the cleaning process execution number may not be indicated in the actual display device 218. Since the end point detection is completed prior to the maximum cycle number (ten times), there is shown that the cleaning completion determination has been normally performed.

The minimum cycle number is a numerical value obtained by dividing the cumulative film thickness (the numerical value indicated by the current value among the maintenance items illustrated in FIG. 6A) by the film thickness which can be removed when the sub recipe is executed once (the numerical value set as the film thickness value indicated on the sub recipe setting screen of FIG. 10). The maximum cycle number is a numerical value obtained by multiplying the minimum cycle number by a calculation constant (a value of the maximum cycle number calculation coefficient preset in FIG. 9) and adding a value of the stable cycle number preset in FIG. 11 to the resultant value of the multiplication. The minimum cycle number and the maximum cycle number are automatically calculated when starting the execution of the sub recipe.

After the sub recipe is repeatedly executed just as much as the minimum cycle number, it is confirmed whether the detection signal transmitted from the concentration detector 252 (the signal for completion detection determination) is stabilized at a predetermined value (the stable upper limit value) or less. That is to say, according to the present embodiment, if the value of the detection signal falls within a range between the stable upper limit value and the stable lower limit value, the end point determination is performed from the next cycle number. In FIG. 13, the end point determination is performed from the time point at which the sub recipe is executed five times. Therefore, it can be noted that the minimum cycle number is five.

As illustrated in FIG. 13, at the sixth execution time, the value of the detection signal is still larger than the stable upper limit value. Therefore, the sixth execution time is not added to the stable cycle number. The condition of adding the stable cycle number is that the maximum value and the minimum value of the detection signal during the execution of the sub recipe stays within the range between the stable upper limit value and the stable lower limit value.

In FIG. 13, the value of the detection signal during the execution of the sub recipe stays within the range between the stable upper limit value and the stable lower limit value from the seventh execution time to the ninth execution time. Thus, it can be noted that the stable cycle number is three. In the case where the cycle number has reached the maximum cycle number prior to reaching the stable cycle number, it is determined that the end point detection is impossible (abnormality determination). Thus, a preset error process is performed.

As described above, in the present embodiment, when executing the cleaning-purpose maintenance recipe, the minimum cleaning process execution number can be calculated by dividing the current value of the target maintenance item (the cumulative film thickness value) by the cumulative value within the cleaning recipe. In the cleaning completion determination, the maximum cleaning process execution number which takes the chattering (vibration) phenomenon of the detection signal into account can be calculated by adding a value, which is obtained by multiplying the minimum cleaning execution number by a predetermined constant, to the execution number of the completion determination which determines it to be a stable state (a pre-cleaning state) if the value of the detection signal consecutively stays between the stable upper and lower limit values.

Accordingly, it is possible to realize a function of reliably executing the cleaning by the minimum cleaning process execution number and completing the cleaning within a finite process execution number without infinitely waiting for the completion condition. Furthermore, the stop of the substrate processing to be executed next time can be designated depending on whether the cleaning completion determination is normal or abnormal. Therefore, it can be prevented that the next substrate processing is performed while the cleaning is abnormally completed. It is therefore possible to suppress an influence of fluctuation in film deposition.

According to the present embodiment, the determination as to whether the signal for completion detection determination is in a stable state may be performed after the sub recipe is executed a predetermined number of times. In this case, control is executed so that, after the execution number f the sub recipe has reached a predetermined number, the signal for completion detection determination stays within the range between the predetermined upper and lower limit values (the range between the stable upper limit value and the stable lower limit value in the present embodiment) for a predetermined time period. In this regard, the predetermined time period is a time calculated by multiplying the execution time required in executing the sub recipe once by the execution number.

Effects According to the Present Embodiment

According to the present embodiment, one or more of the following effects (1) to (5) are achieved.

(1) Since the conventional cleaning recipe is merely executed for a calculated time, it is not possible to determine whether the cleaning is really performed. If a long time is designated, the productivity is worsened. If a short time is designated, it is unclear whether the cleaning is normally performed, and thus it is likely that the next production is adversely affected. However, according to the configuration of the present embodiment which can automatically determine the completion of the cleaning process, the next film formation becomes stable.

(2) In the conventional cleaning, if the completion of cleaning is determined based on a predetermined signal indicating the completion of cleaning, it is not possible to cope with the fluctuation of the predetermined signal. If a condition is met, it is determined that the cleaning has been completed. Therefore, it is likely that the next production is performed in an insufficiently cleaned state. However, according to the configuration of the present embodiment which can automatically determine the completion of the cleaning process, it is possible to provide redundant setting to the cleaning determination conditions. This makes it possible to optimize the cleaning process time. As a result, it becomes possible to improve the productivity.

(3) In the prior art, it is necessary to readjust the cleaning-purpose maintenance recipe each time when the cleaning period is changed. The cleaning recipe also needs to be corrected in conjunction therewith. For that reason, if there is correction mistake or correction oblivion, a problem is posed in that the cleaning is not properly performed. However, according to the configuration of the present embodiment which can automatically determine the completion of the cleaning process, it is possible to minimize the range of influence due to the change of the cleaning period. This makes it possible to avoid lot rejection which may otherwise be caused by correction mistake attributable to the reduction of correction items during the change of the cleaning period.

(4) The present disclosure is not limited to the cleaning process and may be applied to the completion conditions of other processes such as a cycle purge process, a below-described deactivation process and the like.

(5) The cleaning end point determination method of the present embodiment which makes use of the signal value acquired from the concentration detector 252 is effective when it is employed in a deactivation process to be described later. In this regard, it is likely that a Si-based compound adhering to the interior of the process furnace 28, the exhaust system and the pump may be exploded upon exposure to the atmosphere. Thus, the maintenance or the like is performed after the composition of the Si-based compound is changed by supplying a cleaning gas or the like. Changing the composition is called deactivation. Accordingly, for regular deactivation operations, a case-dependent method of supplying a cleaning gas and specifications for the operations are necessary. Even in this case, the technique of determining an appropriate cleaning completion time depending on the behavior of a concentration of a predetermined gas according to the present embodiment is effective when a cleaning gas is supplied in order to change the composition of the Si-based compound.

<Modification of the Present Disclosure>

For example, if the substrate processing apparatus 1 described above is a batch-type vertical apparatus, there may be a case where at least one nozzle (a nozzle for supplying a film forming gas) is installed within a furnace. The cleaning recipe according to this type includes a step of cleaning the interior of the furnace and a step of cleaning the interior of the nozzle, because removal conditions differ between an in-furnace cumulative film thickness and an in-nozzle cumulative film thickness. In this case, the cleaning process using the sub recipe according to the present embodiment may be performed at both the furnace interior cleaning step and the nozzle interior cleaning step.

Alternatively, since a deposit adhering to the interior of the nozzle can be removed by supplying a cleaning gas for a predetermined time, the nozzle interior cleaning may be performed by a cleaning method similar to that of the prior art. The cleaning process using the sub recipe according to the present embodiment may be performed at the furnace interior cleaning step.

Example 1

Next, one specific embodiment of the present disclosure will be described with reference to FIG. 14.

Figure 14:
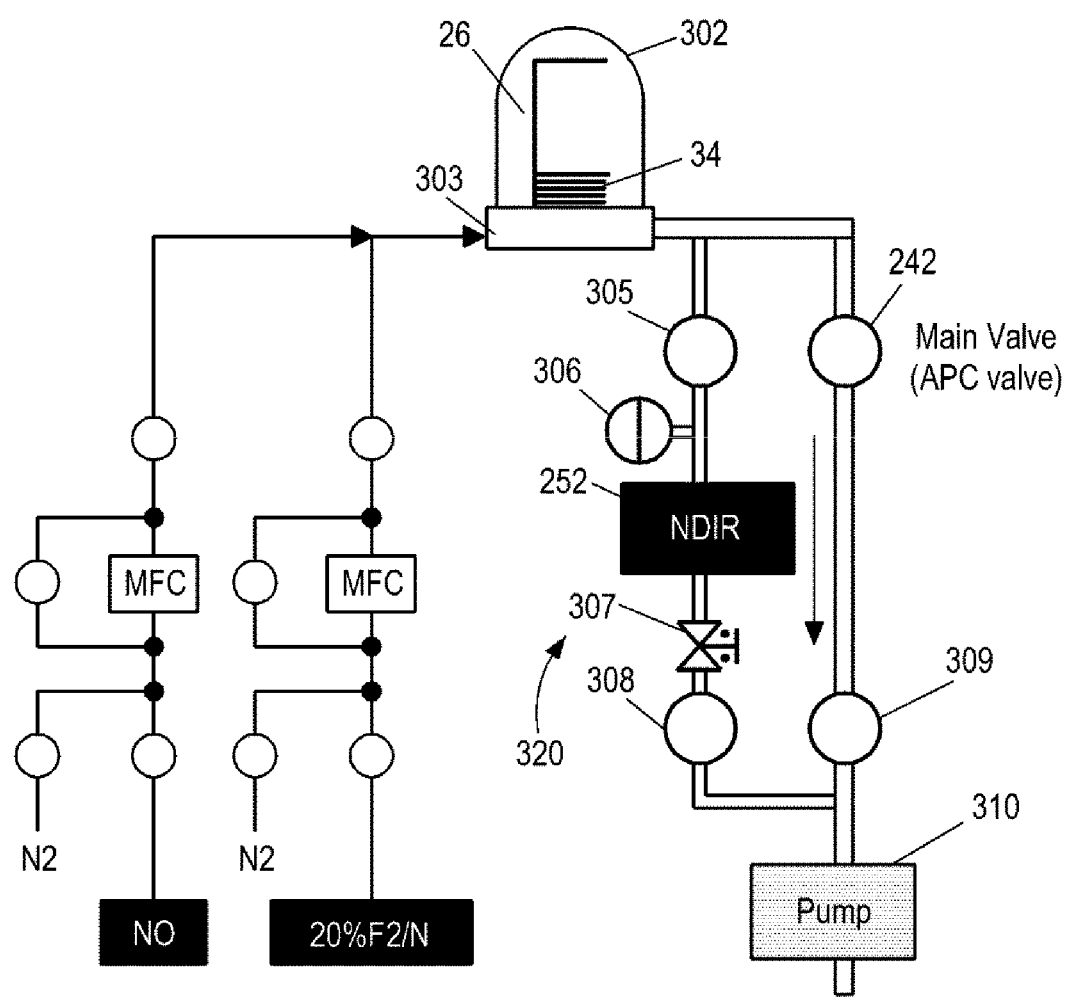
FIG. 14 is a view illustrating details (Example 1) of one embodiment of the substrate processing apparatus according to the present disclosure.

As illustrated in FIG. 14, the substrate processing apparatus 1 includes a substantially cylindrical reaction tube 302 whose longitudinal direction extends in a vertical direction. The reaction tube 302 is made of material superior in heat resistance and corrosion resistance, e.g., quartz.

An apex portion formed in a substantially conical shape so as to have a diameter growing smaller toward the upper end side thereof is provided at the upper end of the reaction tube 302. An exhaust system is configured by an exhaust pipeline and a below-described bypass pipe 320. The exhaust pipeline, on which a pressure regulating mechanism including a pressure valve 242 as a main valve, a valve 309, a pump 310 and the like is arranged, is connected to the reaction tube 302. The internal pressure of the reaction tube 302 is controlled to a desired pressure (vacuum degree) by the pressure regulating mechanism.

A manifold 303 is disposed under the reaction tube 302. The seal cap 34 is moved up by a boat elevator not illustrated. Thus, the manifold 303 disposed under the reaction tube 302 (in the furnace port portion) is closed by the seal cap 34.

The boat 26 is mounted on the seal cap 34. The boat 26 is made of, e.g., quartz. The boat 26 is rotated by a rotating mechanism not illustrated. A heater formed of a resistance heating element is installed around the reaction tube 302 so as to surround the reaction tube 302. The interior of the reaction tube 302 is heated to a predetermined temperature by the heater.

A process gas introduction pipe (not illustrated) which introduces a film forming gas into the reaction tube 302 is inserted through a side surface in the vicinity of the lower end of the reaction tube 302. The process gas introduction pipe is connected to a process gas supply source (not illustrated) via a mass flow controller (MFC) (not illustrated). For example, in the case of forming a silicon nitride film on a wafer 18, a mixed gas of dichlorosilane ($SiH_2Cl_2$) and ammonia ($NH_3$) is used as the film forming gas. A cleaning gas may be a gas capable of removing a deposit adhering to the interior of the substrate processing apparatus 1. For example, in the present embodiment, a mixed gas of fluorine ($F_2$) and nitrogen ($N_2$) is supplied as the cleaning gas.

While the process gas introduction pipe is not illustrated in FIG. 14, a plurality of process gas introduction pipes is installed in a corresponding relationship with the type of gases introduced into the reaction tube 302. Specifically, a film forming gas introduction pipe which introduces a film forming gas into the reaction tube 302 and a cleaning gas introduction pipe which introduces a cleaning gas into the reaction tube 302 are inserted through the manifold 303 of the lower end of the reaction tube 302. Furthermore, a purge gas supply pipe is inserted through the manifold 303 of the lower end of the reaction tube 302. A purge gas supply source (not illustrated) is connected to the purge gas supply pipe via an MFC (not illustrated). A desired amount of purge gas is supplied into the reaction tube 302. Alternatively, a supply pipe which introduces a film forming gas and a cleaning gas may be used in common.

The manifold 303 and the exhaust pipeline are air-tightly connected to each other. In the exhaust pipeline, the pressure valve 242 as a main valve, the valve 309 and the pump 310 are installed in the named order from the upstream side thereof.

The internal pressure of the reaction tube 302 and the exhaust pipeline is controlled to a predetermined pressure by adjusting the opening degree of the main valve 242. The pump 310 exhausts the gas existing within the reaction tube 302 through the exhaust pipeline and regulates the internal pressure of the reaction tube 302, the exhaust pipe 300 and the exhaust pipeline in cooperation with the main valve 242.

The bypass pipe 320 is installed in the exhaust pipeline. In order to detour the main valve 242, the bypass pipe 320 is connected at one end to the exhaust pipeline at the upstream side of the main valve 242 and is connected at the other end to the exhaust pipeline at the downstream side of the main valve 242. The diameter of the bypass pipe 320 is set such that the exhaust flow rate (exhaust flow rate area) of the bypass pipe 320 becomes smaller than that of the exhaust pipeline. In the bypass pipe 320, a valve 305, a pressure sensor 306, a concentration detector 252 including an infrared sensor, a needle valve 307 and a valve 308 are installed in the named order from the upper surface side thereof.

If the valve 305 is opened, a part of the gas flowing through the exhaust pipeline is allowed to flow through the bypass pipe 320. The opening degree of the needle valve 307 is adjusted in advance so that the pressure difference between the opposite ends of the needle valve 307 becomes a predetermined value.

Next, descriptions will be made on a method of cleaning the substrate processing apparatus 1. In the present embodiment, the method of cleaning the substrate processing apparatus 1 will be described by taking, as an example, a case where silicon nitride adhering to the interior of the substrate processing apparatus 1 in the course of forming a silicon nitride film on the wafer 18 is removed. Furthermore, in the present embodiment, descriptions will also be made on a film forming process in which silicon nitride adheres to the interior of the substrate processing apparatus 1. In the following descriptions, the operations of individual parts constituting the substrate processing apparatus 1 are controlled by the device controller 240.

If the interior of the reaction tube 302 which defines the process chamber 29 is stabilized at a predetermined pressure and at a predetermined temperature, the supply of nitrogen from the purge gas supply pipe is stopped. Then, a silicon (Si)-containing gas such as a dichlorosilane ($SiH_2Cl_2$) gas or a hexachlorodisilane ($Si_2Cl_6$) gas or the like as a process gas is introduced from the process gas introduction pipe (not illustrated) into the reaction tube 302 at a predetermined flow rate, e.g., 0.1 liter/min. Furthermore, a nitrogen-containing gas such as, e.g., an ammonia ($NH_3$) gas, as a reaction gas which reacts with the silicon (Si)-containing gas to deposit a nitrogen compound on a substrate, is introduced from the process gas introduction pipe 17 (not illustrated) into the reaction tube 302 at a predetermined flow rate, e.g., 1 liter/min.

The dichlorosilane gas and the ammonia gas introduced into the reaction tube 302 are pyrolyzed by the heat within the reaction tube 302. Thus, silicon nitride ($Si_3N_4$) is deposited on the surface of the wafer 18. These film forming gases may be cyclically supplied to form a film. In this way, a silicon nitride film ($Si_3N_4$ film) is formed on the surface of the wafer 18 (film forming process).

If a silicon nitride film having a predetermined thickness is formed on the surface of the wafer 18, the supply of the dichlorosilane ($SiH_2Cl_2$) gas and the ammonia ($NH_3$) gas from the process gas introduction pipe (not illustrated) is stopped. Then, a nitrogen gas is supplied at a predetermined flow rate from the purge gas supply pipe into the reaction tube 302. At the same time, while controlling the opening degree of the main valve 242, the pump 310 is driven to discharge the gas existing within the reaction tube 302 (purge process). In order to reliably discharge the gas existing within the reaction tube 302, it is preferable to perform cyclic purge by which the supply of the nitrogen gas and the discharge of the gas existing within the reaction tube 302 are repeated multiple times.

Then, the interior of the reaction tube 302 is heated to a predetermined temperature, e.g., 300 degrees C., by the heater (not illustrated) and a nitrogen gas is supplied at a predetermined flow rate from the purge gas supply pipe into the reaction tube 302, thereby returning the internal pressure of the reaction tube 302 to an atmospheric pressure. Finally, the boat is unloaded by moving the seal cap 34 downward by the boat elevator not illustrated (unloading process).

While the film to be deposited on the substrate is the silicon nitride film in this example, it goes without saying that the film to be deposited on the substrate may be a silicon film.

If the film forming process described above is performed multiple times, silicon nitride generated by the film forming process is deposited on (adheres to) not only the surface of the wafer 18 but also the interior of the substrate processing apparatus 1, e.g., the inner wall of the reaction tube 302, the boat 26, the manifold 303 and the exhaust pipeline. For that reason, a method of cleaning the substrate processing apparatus 1 according to the present disclosure (an etching process) is executed after the film forming process is performed a predetermined number of times. Examples of etching conditions include a temperature of less than 400 degrees C., preferably 200 to 350 degrees C., a pressure of 1,330 Pa (10 Torr) to 101,300 Pa (atmospheric pressure), preferably 13,330 Pa (100 Torr) to 53,320 (400 Torr), a $F_2$ gas supply flow rate of 0.5 to 5 slm, a NO gas supply flow rate of 0.5 to 5 slm, a $N_2$ gas supply flow rate of 1 to 20 slm, and a NO gas/$F_2$ gas flow rate ratio of 0.5 to 2. By keeping each of the etching conditions constant at a value which falls within each of the above-described ranges, the deposit including a thin film is etched. In the method of cleaning the substrate processing apparatus 1 according to the present embodiment, as one example of the process conditions, the internal temperature of the reaction tube 302 at a gas cleaning process (a thin film etching process) is 300 degrees C., the $F_2$ gas flow rate is 2.0 slm, the NO gas flow rate is 1.0 slm, and the internal pressure of the reaction tube 302 is 6,000 Pa. A fluorine ($F_2$) gas as a cleaning gas and a nitric oxide (NO) gas as an additive gas are mixed with each other and are introduced into the reaction tube 302, thereby performing removal (cleaning) of silicon nitride ($Si_3N_4$) which adheres to the reaction tube 302, etc. In this cleaning process, the concentration of silicon tetrafluoride ($SiF_4$) contained in the gas discharged from the interior of the reaction tube 302 is measured by the concentration detector 252. The end point of the cleaning is determined based on the concentration of $SiF_4$.

First, the interior of the reaction tube 302 is maintained at a predetermined loading temperature, e.g., 300 degrees C. After a predetermined amount of nitrogen is supplied from the purge gas supply pipe into the reaction tube 302, the boat 26 which does not accommodate the wafer 18 is mounted on the seal cap 34. The seal cap 34 is moved up by the boat elevator not illustrated and the boat 26 is loaded into the reaction tube 302 (loading process).

If the interior of the reaction tube 302 is stabilized at a predetermined pressure and a predetermined temperature, the supply of nitrogen from the purge gas supply pipe is stopped. Then, a cleaning gas is introduced from the process gas introduction pipe not illustrated into the reaction tube 302. In the present embodiment, the cleaning gas introduced into the reaction tube 302 includes fluorine ($F_2$) supplied at a predetermined flow rate, e.g., 2 liter/min, nitric oxide (NO) supplied at a predetermined flow rate, e.g., 1 liter/min, and nitrogen as a dilution gas supplied at a predetermined flow rate, e.g., 8 liter/min.

The cleaning gas thus introduced is heated within the reaction tube 302. Fluorine existing in the cleaning gas is activated into a state in which fluorine has a plurality of free atoms having reactivity. Fluorine thus activated makes contact with silicon nitride ($Si_3N_4$) adhering to the inner wall of the reaction tube 302 and the like, whereby silicon nitride ($Si_3N_4$) adhering to the reaction tube 302 and the like reacts with the cleaning gas ($F_2$).

The reaction product ($SiF_4$) is discharged from the interior of the reaction tube 302 to the outside of the apparatus via the exhaust pipeline, etc. As a result, silicon nitride adhering to the interior of the substrate processing apparatus 1 is removed (cleaning process).

In this regard, the concentration detector 252 may be configured to include the bypass pipe 320 as a collecting part, which collects at least a part of the gas discharged from the reaction tube 302, and an extracting part which extracts a predetermined gas contained in at least a part of the gas collected by the collecting part. At the cleaning process, the concentration of a predetermined gas contained in the gas discharged from the interior of the reaction tube 302, e.g., silicon tetrafluoride ($SiF_4$) in the present embodiment, is measured by the concentration detector 252. If it is determined from the measurement result that silicon tetrafluoride is not contained in the gas discharged from the interior of the reaction tube 302, silicon nitride adhering to the reaction tube 302 and the like is regarded to have been removed. Thus, it is determined that now is the end point of the cleaning process. Since the details of the end point determination are the same as those described above, descriptions thereon will be omitted.

As described above, at the cleaning process, the cleaning gas is introduced into the reaction tube 302 and the cleaning of silicon nitride adhering to the reaction tube 302 and the like is started. Further, by opening the valve 305, a part of the gas discharged from the interior of the reaction tube 302 is introduced from the exhaust pipeline into the bypass pipe 320 (the concentration detector 252). Thus, the gas (particularly, the $SiF_4$ gas) discharged from the interior of the reaction tube 302 is supplied into the cell of the infrared sensor, and the concentration of silicon tetrafluoride ($SiF_4$) is measured by the concentration detector 252. By determining the end point of the cleaning process based on a detection signal detected by the concentration detector 252, it is possible to appropriately clean the substrate processing apparatus 1. Furthermore, it is possible to remove the deposit adhering to the internal members of the apparatus within a proper cleaning time. Moreover, it is possible to reduce the damage suffered by the internal members of the apparatus such as the reaction tube 302 and the like and to suppress generation of particles. In addition, it is possible to reduce the use amount of the cleaning gas.

At the cleaning process, it is preferred that a cell window of an infrared sensor is heated to at least 150 degrees C. by an infrared sensor heater. By heating the cell window to at least 150 degrees C., it is possible to prevent a powder of byproducts, which are discharged from the interior of the reaction tube 302, from adhering to the cell window. As a result, it is possible to prevent the reduction in transmittance of the cell window, which may otherwise be caused by the adhesion of the powder of the byproducts, and to prevent the reduction in performance of the concentration detector 252.

Once the silicon nitride adhering to the interior of the substrate processing apparatus 1 is removed, the introduction of the cleaning gas from the process gas introduction pipe is stopped. Then, nitrogen is supplied at a predetermined flow rate from the purge gas introduction pipe into the reaction tube 302. While controlling the opening degree of the main valve 242, the pump 310 is driven to discharge the gas existing within the reaction tube 302 (purge process).

Then, nitrogen is supplied at a predetermined flow rate from the purge gas supply pipe into the reaction tube 302. While controlling the opening degree of the main valve 242, the pump 310 is driven to return the internal pressure of the reaction tube 302 to an atmospheric pressure. Finally, the seal cap 34 is moved down by the boat elevator not illustrated, thereby unloading the boat 26 (unloading process).

As described above, according to one embodiment of the present disclosure, the end point of the cleaning process is determined using the detection signal detected by the concentration detector 252. This makes it possible to appropriately clean the substrate processing apparatus 1. Furthermore, since the cleaning can be performed within a proper cleaning time, it is possible to reduce the damage suffered by the internal members (components) of the apparatus such as the reaction tube 302 and the like and to suppress generation of particles. In addition, it is possible to reduce the use amount of the cleaning gas.

According to one embodiment of the present disclosure, only the infrared light of an infrared wavelength band absorbed by silicon tetrafluoride contained in the gas discharged from the interior of the reaction tube 302 is incident on the concentration detector 252. Therefore, it is only necessary for the concentration detector 252 to measure the concentration of silicon tetrafluoride only. This makes it possible to simplify the configuration of the concentration detector 252.

Furthermore, in the embodiment described above, the present disclosure has been described by taking, as an example, the case where the bypass pipe 320 is installed in the exhaust pipeline and the concentration detector 252 including the infrared sensor is installed in the bypass pipe 320. However, it is only necessary to measure the concentration of a predetermined gas contained on the exhaust gas discharged from the interior of the reaction tube 302. As an alternative example, the concentration detector 252 including the infrared sensor may be installed in the exhaust pipeline without being installed in the bypass pipe 320. In addition, the measuring part which measures the concentration of a gas may be various types of sensors other than the infrared sensor.

Example 2

Next, another specific embodiment of the present disclosure will be described with reference to FIG. 15.

It is likely that a Si-based compound adhering to the interior the reaction tube 302, the exhaust system and the pump 310 may be exploded when it is suddenly exposed to the air. For that reason, it is necessary to perform the maintenance or the like after the composition of the Si-based compound is changed by supplying a predetermined cleaning gas thereto. In FIG. 15, a $F_2$ gas is supplied as the cleaning gas to react with the Si-based compound, thereby generating $SiF_4$.

Even after the composition of the Si-based compound existing within the process furnace 28 is completely changed to $SiF_4$ by the cleaning gas (namely, even after the cleaning is completed), it is likely that the Si-based compound adheres to the exhaust system. If the cleaning gas cannot be directly supplied to the exhaust system, there is no choice but to supply the cleaning gas via the process furnace 28. Thus, the quartz members existing within the process furnace 28 are over-etched. This may be a cause of generation of particles. In the meantime, when the composition changing process (deactivation process) performed by the cleaning gas is insufficient, it is likely that the Si-based compound is exploded. This is very dangerous because the pipeline of the exhaust system is often exposed to the air during maintenance.

Figure 15:
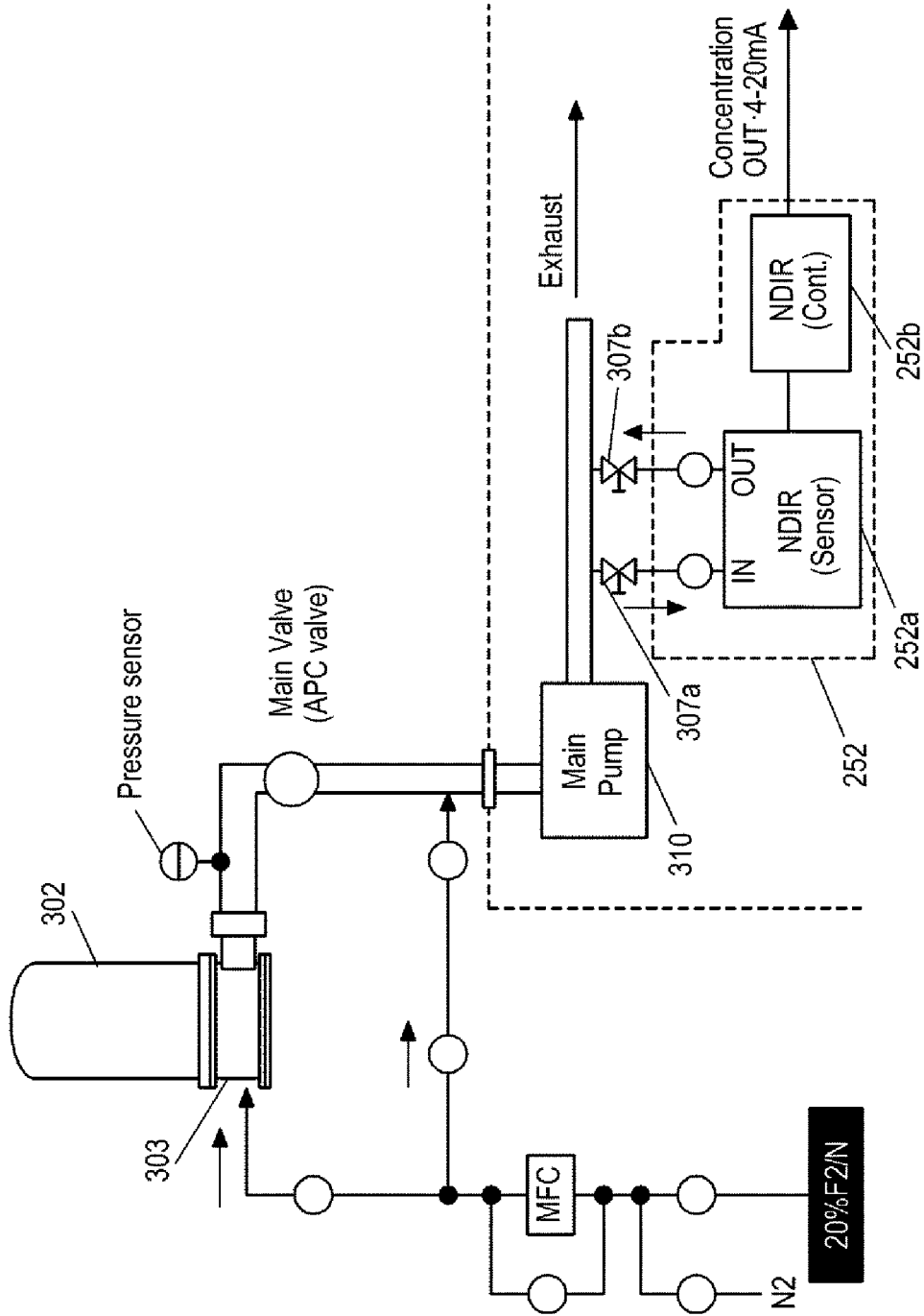
FIG. 15 is a view illustrating details (Example 2) of another embodiment of the substrate processing apparatus according to the present disclosure.

Accordingly, in the present embodiment, as illustrated in FIG. 15, if a maintenance-purpose recipe is executed, a cleaning gas is directly supplied from the gas supply pipe to the exhaust side of the pressure valve (main valve) 242 without going through the process furnace (reactor) 28.

In FIG. 15, the concentration detector 252 is disposed in the exhaust pipeline at the exhaust side of the main pump 310. The concentration detector 252 includes a sensor part 252a for measuring a concentration and a control part 252b which calculates a concentration from the measurement result of the infrared sensor and outputs the concentration thus calculated. The concentration detector 252 is a Non-Dispersive Infrared (NDIR) spectrometer and is a concentration detector which detects a concentration of a predetermined gas contained in the exhaust gas (the gas flowing through the exhaust pipeline at the exhaust side). The concentration detector 252 according to the present embodiment measures a concentration of silicon tetrafluoride ($SiF_4$). As a concentration output, 4 to 20 mA is output to an I/O communication part 255.

As described above, in FIG. 15, silicon tetrafluoride ($SiF_4$) generated in the deactivation process is detected by the concentration detector. The detection result can be used in determining whether the composition changing process of the Si-based compound has been completed.

In the present embodiment, at the cleaning process, the concentration detector 252 detects the predetermined gas contained in the gas discharged from the interior of the process furnace 28 and measures the concentration of silicon tetrafluoride ($SiF_4$) generated by the reaction between the Si-based compound, which adheres to the interior of the process furnace 28, the exhaust system and the pump 310, and the cleaning gas ($F_2$). If it is determined based on the measurement result that silicon tetrafluoride is not contained in the exhaust gas, the deactivation process of the Si-based compound is regarded to have been completed. This makes it possible to determine the completion of the cleaning process.

In Examples 1 and 2, the present disclosure has been described by taking, as an example, the case where the cleaning gas includes a nitrogen gas as a dilution gas. However, the cleaning gas may not include the dilution gas. The dilution gas is preferably an inert gas. In addition to the nitrogen gas, it may be possible to use, e.g., a helium (He) gas, a neon gas (Ne) or an argon gas (Ar) as the dilution gas.

In Examples 1 and 2, the present disclosure has been described by taking, as an example, the case where the concentration of silicon tetrafluoride contained in the exhaust gas is continuously measured at the cleaning process. However, the concentration of silicon tetrafluoride may be measured intermittently, e.g., every several minutes. In this case, it is preferable that the measurement interval is set to become shorter as the cleaning proceeds. Furthermore, a plurality of concentration detectors 252 may be installed in the exhaust pipeline. According to this configuration, even when the type of a film is silicon dioxide, it is possible to appropriately determine completion of the cleaning process by measuring the concentration of silicon tetrafluoride ($SiF_4$) with one infrared sensor and measuring the concentration of HF with another infrared sensor.

In Examples 1 and 2, the present disclosure has been described by taking, as an example, the case where at least one of the internal members of the apparatus is made of quartz. However, at least one of the internal members of the apparatus may be made of, e.g., silicon carbide (SiC).

Other Embodiments of the Present Disclosure

Examples of the deposit adhering to the interior of the apparatus may include silicon nitride, silicon dioxide, titanium nitride, tungsten, polysilicon, aluminum oxide, hafnium oxide, hafnium silicate and hafnium silicate nitride. In this case, examples of the predetermined gas may include silicon tetrafluoride, silicon tetrachloride, nitrogen trifluoride, titanium tetrachloride, titanium tetrafluoride, tungsten tetrafluoride, tungsten hexafluoride, aluminum tetrafluoride, hafnium tetrachloride, hafnium tetrafluoride, and byproducts thereof.

For example, in the case where the deposit adhering to the interior of the substrate processing apparatus 1 is silicon dioxide ($SiO_2$), it may be possible to use, as the cleaning gas, a gas containing hydrogen fluoride, a gas containing fluorine and hydrogen fluoride, a gas containing hydrogen fluoride and ammonia, or the like. In this case, the gas to be measured may preferably be silicon tetrafluoride ($SiF_4$).

In the case where chlorine trifluoride ($ClF_3$) is used as the cleaning gas, the gas to be measured may preferably be the following gases depending on the type of films to be formed on an object to be processed. In the case where a silicon nitride ($Si_3N_4$) film or a silicon oxide (SiO) film is formed on an object to be processed, the gas to be measured may preferably be silicon tetrafluoride ($SiF_4$), silicon tetrachloride ($SiCl_4$) or nitrogen trifluoride ($NF_3$). In the case where a titanium nitride (TiN) film is formed on an object to be processed, the gas to be measured may preferably be titanium tetrachloride ($TiCl_4$), titanium tetrafluoride ($TiF_4$) or nitrogen trifluoride ($NF_3$). In the case where a tungsten (W) film is formed on an object to be processed, the gas to be measured may preferably be tungsten tetrafluoride ($WF_4$). In the case where a tungsten silicon oxide ($WSiO_2$) film is formed on an object to be processed, the gas to be measured may preferably be silicon tetrafluoride ($SiF_4$) or tungsten hexafluoride ($WF_6$).

In the case where a silicon dioxide ($SiO_2$) film is formed on the surface of the wafer 18 using TEOS ($Si(C_2H_5O)_4$), a byproduct composed of silicon dioxide, carbon, hydrogen, oxygen or the like adheres to the interior of the substrate processing apparatus 1. By using, e.g., a gas containing hydrogen fluoride (HF) and ammonia ($NH_3$) as the cleaning gas and using, e.g., ethanol ($C_2H_5OH$) as the gas to be measured, it is possible to determine an end point of cleaning using a detection signal detected by the concentration detectors 252 having infrared sensors.

In the case where a deposit adhering to the interior of the substrate processing apparatus 1 is aluminum oxide (AlO), hafnium oxide (HfO), hafnium silicate or hafnium silicate nitride, examples of the gas to be measured include aluminum tetrafluoride ($AlF_4$), hafnium tetrachloride ($HfCl_4$) and hafnium tetrafluoride ($HfF_4$).

As described above, in the configuration of the process furnace 28 according to the present disclosure, the substrate processing apparatus 1 is configured as a batch-type apparatus which processes a plurality of wafers 18. However, the present disclosure is not limited thereto and may be applied to a single-substrate-type apparatus which processes one wafer 18 at a time.

For example, in the above-described embodiment, there has been taken an example in which the substrate as a processing target is a semiconductor wafer. However, the present disclosure is not limited thereto and may suitably be applied to a substrate processing apparatus which processes a glass substrate such as an LCD (Liquid Crystal Display) panel or the like.

In addition, the present disclosure is not limited to, for example, the above-described embodiment. That is to say, it may be possible to perform other film forming processes such as a process of forming an oxide film or a nitride film and a process of forming a metal-containing film. The detailed contents of substrate processing do not matter. Furthermore, the present disclosure may be suitably applied to other substrate processing apparatuses such as, e.g., an oxidizing apparatus, a nitriding apparatus, an exposure apparatus, a coating apparatus and a CVD apparatus using plasma.

Next, preferred aspects of the present disclosure will be stated as supplementary notes.

[Supplementary Note 1]

According to one aspect of the present disclosure, there is provided a cleaning method, including: cleaning a component in which a deposit adhering to the component constituting an apparatus is removed by supplying and discharging a cleaning gas, wherein the act of cleaning includes controlling the apparatus so that a signal, which indicates a concentration of a predetermined gas generated by a reaction of the deposit and the cleaning gas, reaches a predetermined upper limit value or less and then stays within a range between the predetermined upper limit value and a predetermined lower limit value for a predetermined time period.

[Supplementary Note 2]

Preferably, in the cleaning method of Supplementary Note 1, the cleaning gas includes halogen-containing gases, such as a fluorine ($F_2$) gas, a hydrogen fluoride (HF) gas, a chlorine trifluoride ($ClF_3$) gas and a nitrogen trifluoride ($NF_3$) gas, which contain halogen such as fluorine (F) or chlorine (Cl), or a combination of the halogen-containing gases.

[Supplementary Note 3]

Preferably, in the cleaning method of Supplementary Note 1, the deposit adhering to the component is at least one selected from a group consisting of silicon nitride ($Si_3N_4$), silicon dioxide ($SiO_2$), titanium nitride (TiN), tungsten (W), polysilicon (Poly-Si), aluminum oxide (AlO), hafnium oxide (HfO), hafnium silicate and hafnium silicate nitride.

[Supplementary Note 4]

Preferably, in the cleaning method of Supplementary Note 1, wherein the predetermined gas is at least one selected from a group consisting of silicon tetrafluoride ($SiF_4$), silicon tetrachloride ($SiCl_4$), nitrogen trifluoride ($NF_3$), titanium tetrachloride (TiCl$_4$), titanium tetrafluoride (TiF$_4$), tungsten tetrafluoride (WF$_4$), tungsten hexafluoride (WF$_6$), aluminum tetrafluoride (AlF$_4$), hafnium tetrachloride (HfCl$_4$), hafnium tetrafluoride (HfF$_4$) and a byproduct thereof

[Supplementary Note 5]

According to another aspect of the present disclosure, there is provided a method of manufacturing a semiconductor device, the method including: processing a substrate by supplying a process gas; and cleaning a component in which a deposit adhering to the component constituting an apparatus is removed by supplying and discharging a cleaning gas, wherein the act of cleaning includes controlling the apparatus so that a signal, which indicates a concentration of a predetermined gas generated by a reaction of the deposit and the cleaning gas, reaches a predetermined upper limit value or less and then stays within a range between the predetermined upper limit value and a predetermined lower limit value for a predetermined time period.

[Supplementary Note 6]

Preferably, in the method of manufacturing a semiconductor device of Supplementary Note 5, the cleaning gas includes halogen-containing gases, such as a fluorine (F$_2$) gas, a hydrogen fluoride (HF) gas, a chlorine trifluoride (ClF$_3$) gas and a nitrogen trifluoride (NF$_3$) gas, which contain halogen such as fluorine (F) or chlorine (Cl), or a combination of the halogen-containing gases.

[Supplementary Note 7]

Preferably, in the method of manufacturing a semiconductor device of Supplementary Note 5, the deposit adhering to the component is at least one selected from a group consisting of silicon nitride (Si$_3$N$_4$), silicon dioxide (SiO$_2$), titanium nitride (TiN), tungsten (W), polysilicon (Poly-Si), aluminum oxide (AlO), hafnium oxide (HfO), hafnium silicate and hafnium silicate nitride.

[Supplementary Note 8]

Preferably, in the method of manufacturing a semiconductor device of Supplementary Note 5, the predetermined gas is at least one selected from a group consisting of silicon tetrafluoride (SiF$_4$), silicon tetrachloride (SiCl$_4$), nitrogen trifluoride (NF$_3$), titanium tetrachloride (TiCl$_4$), titanium tetrafluoride (TiF$_4$), tungsten tetrafluoride (WF$_4$), tungsten hexafluoride (WF$_6$), aluminum tetrafluoride (AlF$_4$), hafnium tetrachloride (HfCl$_4$), hafnium tetrafluoride (HfF$_4$) and a byproduct thereof.

[Supplementary Note 9]

According to another aspect of the present disclosure, there is provided a substrate processing apparatus that processes a substrate by supplying a process gas, the apparatus including: a cleaning gas supply part configured to supply a cleaning gas; a discharge part configured to discharge the process gas or the cleaning gas; and a cleaning control part configured to control the cleaning gas supply part and the discharge part so as to remove a deposit adhering to a component constituting the apparatus by discharging a predetermined gas generated by a reaction of the deposit and the cleaning gas, wherein the cleaning control part controls the apparatus so that a signal indicating a concentration of the predetermined gas reaches a predetermined upper limit value or less and then stays within a range between the predetermined upper limit value and a predetermined lower limit value for a predetermined time period.

[Supplementary Note 10]

Preferably, the substrate processing apparatus of Supplementary Note 9 may further include: a measuring part configured to measure the concentration of the predetermined gas, wherein the discharge part includes a discharge path connected to a process chamber which processes the substrate and a pump installed in the discharge path, and the measuring part is installed in the discharge path at an upstream side of the pump.

[Supplementary Note 11]

Preferably, the substrate processing apparatus of Supplementary Note 9 may further include: a measuring part configured to measure the concentration of the predetermined gas, wherein the discharge part includes a discharge path connected to a process chamber which processes the substrate and a pump installed in the discharge path, and the measuring part is installed in the discharge path at a downstream side of the pump.

[Supplementary Note 12]

Preferably, in the substrate processing apparatus of any one of Supplementary Notes 9 to 11, the predetermined gas is at least one selected from a group consisting of silicon tetrafluoride (SiF$_4$), silicon tetrachloride (SiCl$_4$), nitrogen trifluoride (NF$_3$), titanium tetrachloride (TiCl$_4$), titanium tetrafluoride (TiF$_4$), tungsten tetrafluoride (WF$_4$), tungsten hexafluoride (WF$_6$), aluminum tetrafluoride (AlF$_4$), hafnium tetrachloride (HfCl$_4$), hafnium tetrafluoride (HfF$_4$) and a byproduct thereof

[Supplementary Note 13]

Preferably, in the substrate processing apparatus of Supplementary Note 10 or 11, the measuring part includes a collecting part configured to collect at least a part of a gas discharged from the process chamber and an extracting part configured to extract the predetermined gas contained in the at least a part of the gas collected by the collecting part.

[Supplementary Note 14]

Preferably, in the substrate processing apparatus of Supplementary Note 10 or 11, the measuring part includes a plurality of measuring portions provided in the discharge path.

[Supplementary Note 15]

Preferably, the substrate processing apparatus of Supplementary Note 9 may further include: a memory part configured to store at least one recipe (cleaning recipe) for removing the deposit adhering to the component constituting the apparatus; and an execution part configured to execute the recipe stored in the memory part, wherein the cleaning recipe includes a cleaning step of executing a cleaning process, and in the cleaning step, a sub recipe including a gas cleaning process is repeatedly executed at least until the signal indicating the concentration of the predetermined gas reaches the predetermined upper limit value or less.

[Supplementary Note 16]

Preferably, in the substrate processing apparatus of Supplementary Note 15, an execution number of the sub recipe is a number of times between a first predetermined number (a minimum cycle number) and a second predetermined number (a maximum cycle number).

[Supplementary Note 17]

Preferably, in the substrate processing apparatus of Supplementary Note 15, the first predetermined number is a numerical value obtained by dividing a current cumulative film thickness value by a film thickness value which indicates an amount of a film that is being removed when the sub recipe is executed once.

[Supplementary Note 18]

Preferably, in the substrate processing apparatus of Supplementary Note 16, after execution of the sub recipe, if the execution number exceeds the second predetermined number (the maximum cycle number), an alarm indicating an end point detection incapability is notified.

[Supplementary Note 19]

Preferably, in the substrate processing apparatus of Supplementary Note 9 or 15, the component is a part which constitutes the process furnace 28 (or the process chamber 29).

[Supplementary Note 20]

Preferably, in the substrate processing apparatus of Supplementary Note 19, the component is the reaction tube 302.

[Supplementary Note 21]

According to another aspect of the present disclosure, there is provided a non-transitory computer-readable recording medium which stores a cleaning completion determining program configured to clean a component constituting an apparatus, the program including: removing a deposit adhering to the component by supplying and discharging a cleaning gas; and controlling the apparatus so that a signal, which indicates a concentration of a predetermined gas generated by a reaction of the deposit and the cleaning gas, reaches a predetermined upper limit value or less and then stays within a range between the predetermined upper limit value and a predetermined lower limit value for a predetermined time period.

[Supplementary Note 22]

According to another aspect of the present disclosure, there is provided a method of determining completion of cleaning in which a component constituting an apparatus is cleaned by supplying and discharging a cleaning gas, the method including: determining whether a signal, which indicates a concentration of a predetermined gas generated by a reaction of a deposit adhering to the component and the cleaning gas, reaches a predetermined upper limit value or less and then stays within a range between the predetermined upper limit value and a predetermined lower limit value for a predetermined time period.

[Supplementary Note 23]

Preferably, in the method of determining completion of cleaning of Supplementary Note 22, wherein the cleaning gas includes halogen-containing gases, such as a fluorine ($F_2$) gas, a hydrogen fluoride (HF) gas, a chlorine trifluoride ($ClF_3$) gas and a nitrogen trifluoride ($NF_3$) gas, which contain halogen such as fluorine (F) or chlorine (Cl), or a combination of the halogen-containing gases.

[Supplementary Note 24]

Preferably, in the method of determining completion of cleaning of Supplementary Note 22, the deposit adhering to the component is at least one selected from a group consisting of silicon nitride ($Si_3N_4$), silicon dioxide ($SiO_2$), titanium nitride (TiN), tungsten (W), polysilicon (Poly-Si), aluminum oxide (AlO), hafnium oxide (HfO), hafnium silicate and hafnium silicate nitride.

[Supplementary Note 25]

Preferably, in the method of determining completion of cleaning of Supplementary Note 22, the predetermined gas is at least one selected from a group consisting of silicon tetrafluoride ($SiF_4$), silicon tetrachloride ($SiCl_4$), nitrogen trifluoride ($NF_3$), titanium tetrachloride ($TiCl_4$), titanium tetrafluoride ($TiF_4$), tungsten tetrafluoride ($WF_4$), tungsten hexafluoride ($WF_6$), aluminum tetrafluoride ($AlF_4$), hafnium tetrachloride ($HfCl_4$), hafnium tetrafluoride ($HfF_4$) and a byproduct thereof

[Supplementary Note 26]

According to another aspect of the present disclosure, there is provided a method of manufacturing a semiconductor device, including: processing a substrate by supplying a process gas; and cleaning a component in which a deposit adhering to the component constituting an apparatus is removed by supplying and discharging a cleaning gas, wherein the act of cleaning includes determining whether a signal, which indicates a concentration of a predetermined gas generated by a reaction of the deposit and the cleaning gas, reaches a predetermined upper limit value or less and then stays within a range between the predetermined upper limit value and a predetermined lower limit value for a predetermined time period.

[Supplementary Note 27]

Preferably, in the method of manufacturing a semiconductor device of Supplementary Note 26, the cleaning gas includes halogen-containing gases, such as a fluorine ($F_2$) gas, a hydrogen fluoride (HF) gas, a chlorine trifluoride ($ClF_3$) gas and a nitrogen trifluoride ($NF_3$) gas, which contain halogen such as fluorine (F) or chlorine (Cl), or a combination of the halogen-containing gases.

[Supplementary Note 28]

Preferably, in the method of manufacturing a semiconductor device of Supplementary Note 26, the deposit adhering to the component is at least one selected from a group consisting of silicon nitride ($Si_3N_4$), silicon dioxide ($SiO_2$), titanium nitride (TiN), tungsten (W), polysilicon (Poly-Si), aluminum oxide (AlO), hafnium oxide (HfO), hafnium silicate and hafnium silicate nitride.

[Supplementary Note 29]

Preferably, in the method of manufacturing a semiconductor device of Supplementary Note 26, wherein the predetermined gas is at least one selected from a group consisting of silicon tetrafluoride ($SiF_4$), silicon tetrachloride ($SiCl_4$), nitrogen trifluoride ($NF_3$), titanium tetrachloride ($TiCl_4$), titanium tetrafluoride ($TiF_4$), tungsten tetrafluoride ($WF_4$), tungsten hexafluoride ($WF_6$), aluminum tetrafluoride ($AlF_4$), hafnium tetrachloride ($HfCl_4$), hafnium tetrafluoride ($HfF_4$) and a byproduct thereof.

[Supplementary Note 30]

According to another aspect of the present disclosure, there is provided a substrate processing apparatus that processes a substrate by supplying a process gas, the apparatus including: a cleaning gas supply part configured to supply a cleaning gas; a discharge part configured to discharge the process gas or the cleaning gas; and a cleaning control part configured to control the cleaning gas supply part and the discharge part so as to remove a deposit adhering to a component constituting the apparatus by discharging a predetermined gas generated by a reaction of the deposit and the cleaning gas, wherein the discharge part includes a measuring part configured to measure a concentration of the predetermined gas, and the cleaning control part acquires a signal indicating the concentration of the predetermined gas using the measuring part and determines whether the acquired signal reaches a predetermined upper limit value or less and then stays within a range between the predetermined upper limit value and a predetermined lower limit value for a predetermined time period.

[Supplementary Note 31]

Preferably, in the substrate processing apparatus of Supplementary Note 30, the discharge part includes a discharge path connected to a process chamber which processes the substrate and a pump installed in the discharge path, and the measuring part is installed in the discharge path at an upstream side of the pump.

[Supplementary Note 32]

Preferably, in the substrate processing apparatus of Supplementary Note 30, the discharge part includes a discharge path connected to a process chamber which processes the substrate and a pump installed in the discharge path, and the measuring part is installed in the discharge path at a downstream side of the pump.

[Supplementary Note 33]

Preferably, in the substrate processing apparatus of any one of Supplementary Notes 30 to 32, the predetermined gas is at least one selected from a group consisting of silicon tetrafluoride ($SiF_4$), silicon tetrachloride ($SiCl_4$), nitrogen trifluoride ($NF_3$), titanium tetrachloride ($TiCl_4$), titanium tetrafluoride ($TiF_4$), tungsten tetrafluoride ($WF_4$), tungsten hexafluoride ($WF_6$), aluminum tetrafluoride ($AlF_4$), hafnium tetrachloride ($HfCl_4$), hafnium tetrafluoride ($HfF_4$) and a byproduct thereof

[Supplementary Note 34]

Preferably, in the substrate processing apparatus of Supplementary Note 31 or 32, the measuring part includes a collecting part configured to collect at least a part of a gas discharged from the process chamber and an extracting part configured to extract the predetermined gas contained in the at least a part of the gas collected by the collecting part.

[Supplementary Note 35]

Preferably, in the substrate processing apparatus of Supplementary Note 31 or 32, wherein the measuring part includes a plurality of measuring portions provided in the discharge path.

[Supplementary Note 36]

Preferably, the substrate processing apparatus of Supplementary Note 30 may further include: a memory part configured to store at least one recipe (cleaning recipe) for removing the deposit adhering to the component constituting the apparatus; and an execution part configured to execute the recipe stored in the memory part, wherein the cleaning recipe includes a cleaning step of executing a cleaning process, an in the cleaning step, a sub recipe including at least a gas cleaning process is executed at least a predetermined number of times.

[Supplementary Note 37]

Preferably, in the substrate processing apparatus of Supplementary Note 36, the sub recipe further includes an exhaust process, and a cyclic cleaning which repeats the cleaning process and the exhaust process in a time series manner is realized by executing the sub recipe.

[Supplementary Note 38]

Preferably, in the substrate processing apparatus of Supplementary Note 30, the predetermined number of times is a numerical value obtained by dividing a current cumulative film thickness value by a film thickness value which indicates an amount of a film that is being removed when the sub recipe is executed once.

[Supplementary Note 39]

Preferably, in the substrate processing apparatus of Supplementary Note 38, the predetermined number of times is a first predetermined number (a minimum cycle number), and the sub recipe is executed a predetermined number of times between the first predetermined number (the minimum cycle number) and a second predetermined number (a maximum cycle number).

[Supplementary Note 40]

Preferably, in the substrate processing apparatus of Supplementary Note 38, after the predetermined number of times, it is confirmed whether a maximum value and a minimum value of the signal acquired during the execution of the sub recipe stay within the range between the predetermined upper and lower limit values.

[Supplementary Note 41]

Preferably, in the substrate processing apparatus of Supplementary Note 38, after the predetermined number of times, a maximum value and a minimum value of the signal acquired during the execution of the sub recipe are monitored, and if the number of times at which the maximum value and the minimum value of the signal consecutively stay within the range between the predetermined upper and lower limit values reaches a third predetermined number (a stable cycle number) between the first predetermined number (the minimum cycle number) and the second predetermined number (the maximum cycle number), cleaning completion determination is regarded as a normal determination.

[Supplementary Note 42]

Preferably, in the substrate processing apparatus of Supplementary Note 39 or 41, if the execution number of the sub recipe exceeds the second predetermined number (the maximum cycle number), cleaning completion determination is regarded as an abnormal determination and an alarm indicating an end point detection incapability is notified.

[Supplementary Note 43]

Preferably, in the substrate processing apparatus of Supplementary Note 41 or 42, after the cleaning completion determination, a next step of the cleaning recipe is executed and the cleaning recipe is terminated.

[Supplementary Note 44]

Preferably, in the substrate processing apparatus of Supplementary Note 30 or 36, the component is a part which constitutes the process furnace.

[Supplementary Note 45]

Preferably, in the substrate processing apparatus of Supplementary Note 44, the component is the reaction tube 302.

[Supplementary Note 46]

According to another aspect of the present disclosure, there is provided a non-transitory computer-readable recording medium which stores a cleaning completion determining program configured to clean a component constituting an apparatus, the program including: removing a deposit adhering to the component by supplying and discharging a cleaning gas; measuring a concentration of a predetermined gas generated by a reaction of the deposit and the cleaning gas; and determining whether a signal indicating the concentration reaches a predetermined upper limit value or less and then stays within a range between the predetermined upper limit value and a predetermined lower limit value for a predetermined time period.

[Supplementary Note 47]

According to another aspect of the present disclosure, there is provided a method of determining completion of cleaning in which an interior of a process chamber that processes a substrate is cleaned by supplying and discharging a cleaning gas, the method including determining whether a signal, which indicates a concentration of a predetermined gas generated by a reaction of a deposit adhering to an inner wall of the process chamber and the cleaning gas, reaches a predetermined upper limit value or less and then stays within a range between the predetermined upper limit value and a predetermined lower limit value for a predetermined time period.

[Supplementary Note 48]

According to another aspect of the present disclosure, there is provided a method of manufacturing a semiconductor device, the including: processing a substrate by supplying a process gas; and cleaning an inner wall in which a deposit adhering to the inner wall of a process chamber that processes the substrate is removed by supplying and discharging a cleaning gas, wherein the act of cleaning includes determining whether a signal, which indicates a concentration of a predetermined gas generated by a reaction of the deposit and the cleaning gas, reaches a predetermined upper limit value or less and then stays within a range between the predetermined upper limit value and a predetermined lower limit value for a predetermined time period.

[Supplementary Note 49]

According to another aspect of the present disclosure, there is provided a substrate processing apparatus having at least a process chamber that processes a substrate by supplying a process gas, the apparatus including: a cleaning gas supply part configured to supply a cleaning gas into the process chamber; a discharge part configured to discharge the process gas or the cleaning gas from an interior of the process chamber; and a cleaning control part configured to control the cleaning gas supply part and the discharge part so as to remove a deposit adhering to an inner wall of the process chamber by discharging a predetermined gas generated by a reaction of the deposit and the cleaning gas, wherein the discharge part includes a measuring part configured to measure a concentration of the predetermined gas, and the cleaning control part acquires a signal indicating the concentration of the predetermined gas using the measuring part and determines whether the acquired signal reaches a predetermined upper limit value or less and then stays within a range between the predetermined upper limit value and a predetermined lower limit value for a predetermined time period.

[Supplementary Note 50]

According to another aspect of the present disclosure, there is provided a non-transitory computer-readable recording medium which stores a cleaning completion determining program configured to clean an interior of a process chamber that processes a substrate, the program including: removing a deposit adhering to an inner wall of the process chamber by supplying and discharging a cleaning gas; measuring a concentration of a predetermined gas generated by a reaction of the deposit and the cleaning gas; and determining whether a signal indicating the concentration reaches a predetermined upper limit value or less and then stays within a range between the predetermined upper limit value and a predetermined lower limit value for a predetermined time period.

[Supplementary Note 51]

According to another aspect of the present disclosure, there is provided a method of determining completion of cleaning in which a reaction tube is cleaned by supplying and discharging a cleaning gas, to the method including: determining whether a signal, which indicates a concentration of a predetermined gas generated by a reaction of a deposit adhering to the reaction tube and the cleaning gas, reaches a predetermined upper limit value or less and then stays within a range between the predetermined upper limit value and a predetermined lower limit value for a predetermined time period.

[Supplementary Note 52]

According to another aspect of the present disclosure, there is provided a method of manufacturing a semiconductor device, the method including: processing a substrate by supplying a process gas into a reaction tube; and cleanings the reaction tube in which a deposit adhering to the reaction tube is removed by supplying and discharging a cleaning gas, wherein the act of cleaning includes determining whether a signal, which indicates a concentration of a predetermined gas generated by a reaction of the deposit and the cleaning gas, reaches a predetermined upper limit value or less and then stays within a range between the predetermined upper limit value and a predetermined lower limit value for a predetermined time period.

[Supplementary Note 53]

According to another aspect of the present disclosure, there is provided a substrate processing apparatus that processes a substrate by supplying a process gas into a reaction tube, the apparatus including: a cleaning gas supply part configured to supply a cleaning gas into the reaction tube; a discharge part configured to discharge the process gas or the cleaning gas from an interior of the reaction tube; and a cleaning control part configured to control the cleaning gas supply part and the discharge part so as to remove a deposit adhering to the reaction tube by discharging a predetermined gas generated by a reaction of the deposit and the cleaning gas, wherein the discharge part includes a measuring part configured to measure a concentration of the predetermined gas, and the cleaning control part acquires a signal indicating the concentration of the predetermined gas using the measuring part and determines whether the acquired signal reaches a predetermined upper limit value or less and then stays within a range between the predetermined upper limit value and a predetermined lower limit value for a predetermined time period.

[Supplementary Note 54]

According to another aspect of the present disclosure, there is provided a computer-readable recording medium which stores a cleaning completion determining program configured to clean a reaction tube, the program including: removing a deposit adhering to the reaction tube by supplying and discharging a cleaning gas; measuring a concentration of a predetermined gas generated by a reaction of the deposit and the cleaning gas; and determining whether a signal indicating the concentration reaches a predetermined upper limit value or less and then stays within a range between the predetermined upper limit value and a predetermined lower limit value for a predetermined time period.

[Supplementary Note 55]

According to another aspect of the present disclosure, there is provided a method of determining completion of cleaning in which an interior of a reactor heated to a predetermined temperature is cleaned by supplying and discharging a cleaning gas, the method including: determining whether a signal, which indicates a concentration of a predetermined gas generated by a reaction of a deposit adhering to the reaction tube and the cleaning gas, reaches a predetermined upper limit value or less and then stays within a range between the predetermined upper limit value and a predetermined lower limit value for a predetermined time period.

[Supplementary Note 56]

According to another aspect of the present disclosure, there is provided a method of manufacturing a semiconductor device, the method including: processing a substrate by supplying a process gas into a reactor heated to a predetermined temperature; and cleaning a component in which a deposit adhering to the component constituting the reactor is removed by supplying and discharging a cleaning gas, wherein the act of cleaning includes: determining whether a signal, which indicates a concentration of a predetermined gas generated by a reaction of the deposit and the cleaning gas reaches, a predetermined upper limit value or less and then stays within a range between the predetermined upper limit value and a predetermined lower limit value for a predetermined time period.

[Supplementary Note 57]

According to another aspect of the present disclosure, there is provided a substrate processing apparatus that processes a substrate by supplying a process gas into a reactor, the apparatus including: a heating part configured to heat an interior of the reactor to a predetermined temperature; a cleaning gas supply part configured to supply a cleaning gas into the reactor; a discharge part configured to discharge the process gas or the cleaning gas from the interior of the reactor; and a cleaning control part configured to control the cleaning gas supply part and the discharge part so as to remove a deposit adhering to a component constituting the reactor by discharging a predetermined gas generated by a reaction of the deposit and the cleaning gas, wherein the discharge part includes a measuring part configured to measure a concentration of the predetermined gas, and the cleaning control part acquires a signal indicating the concentration of the predetermined gas using the measuring part and determines whether the acquired signal reaches a predetermined upper limit value or less and then stays within a range between the predetermined upper limit value and a predetermined lower limit value for a predetermined time period.

[Supplementary Note 58]

According to another aspect of the present disclosure, there is provided a non-transitory computer-readable recording medium which stores a cleaning completion determining program configured to clean an interior of a reactor heated to a predetermined temperature, the program including: removing a deposit adhering to a component constituting the reactor by supplying and discharging a cleaning gas; measuring a concentration of a predetermined gas generated by a reaction of the deposit and the cleaning gas; and determining whether a signal indicating the concentration reaches a predetermined upper limit value or less and then stays within a range between the predetermined upper limit value and a predetermined lower limit value for a predetermined time period.

[Supplementary Note 59]

According to another aspect of the present disclosure, there is provided a method of determining completion of cleaning in which a deactivation process is performed by supplying a cleaning gas to an exhaust pipeline, the method including: determining whether a signal, which indicates a concentration of a predetermined gas generated by a reaction of a deposit adhering to the exhaust pipeline and the cleaning gas, reaches a predetermined upper limit value or less and then stays within a range between the predetermined upper limit value and a predetermined lower limit value for a predetermined time period.

[Supplementary Note 60]

According to another aspect of the present disclosure, there is provided a method of manufacturing a semiconductor device, the method including: processing a substrate by supplying a process gas; and cleaning an exhaust pipeline in which a deactivation process is performed by supplying a cleaning gas to the exhaust pipeline, wherein the act of cleaning includes: determining whether a signal, which indicates a concentration of a predetermined gas generated by a reaction of a deposit adhering to the exhaust pipeline and the cleaning gas, reaches a predetermined upper limit value or less and then stays within a range between the predetermined upper limit value and a predetermined lower limit value for a predetermined time period.

[Supplementary Note 61]

According to another aspect of the present disclosure, there is provided a substrate processing apparatus that processes a substrate by supplying a process gas into a reaction tube, the apparatus including: a cleaning gas supply part configured to supply a cleaning gas into the reaction tube or an exhaust pipeline; a discharge part provided with the exhaust pipeline; and a cleaning control part configured to control the cleaning gas supply part and the discharge part so as to remove a deposit adhering to the exhaust pipeline by discharging a predetermined gas generated by a reaction of the deposit and the cleaning gas, wherein the discharge part includes a measuring part configured to measure a concentration of the predetermined gas, and the cleaning control part acquires a signal indicating the concentration of the predetermined gas using the measuring part and determines whether the acquired signal reaches a predetermined upper limit value or less and then stays within a range between the predetermined upper limit value and a predetermined lower limit value for a predetermined time period.

[Supplementary Note 54]

According to another aspect of the present disclosure, there is provided a non-transitory computer-readable recording medium which stores a cleaning completion determining program configured to deactivate an interior of an exhaust pipeline, the program including: removing a deposit adhering to the exhaust pipeline by supplying a cleaning gas to the exhaust pipeline; measuring a concentration of a predetermined gas generated by a reaction of the deposit and the cleaning gas; and determining whether a signal indicating the concentration reaches a predetermined upper limit value or less and then stays within a range between the predetermined upper limit value and a predetermined lower limit value for a predetermined time period.

[Supplementary Note 55]

According to another aspect of the present disclosure, there is provided a method of determining completion of cleaning in which a deposit adhering to a reaction tube is removed, the method including: when the reaction tube is cleaned by supplying a cleaning gas into the reaction tube, measuring a signal indicating a concentration of a predetermined gas contained in a gas discharged from the reaction tube; and determining whether the signal indicating the concentration reaches a predetermined threshold value and then converges within a range between predetermined upper and lower limit values.

[Supplementary Note 56]

According to another aspect of the present disclosure, there is provided a method of manufacturing a semiconductor device, the method including: forming a film on a substrate by supplying a process gas into a reaction tube; and cleaning the reaction tube in which a deposit adhering to the reaction tube is removed, wherein the act of cleaning the reaction tube by supplying a cleaning gas into the reaction tube includes determining whether a signal, which indicates a concentration of a predetermined gas contained in a gas discharged from the reaction tube, reaches a predetermined threshold value and then converges within a range between predetermined upper and a predetermined lower limit values.

[Supplementary Note 65]

According to another aspect of the present disclosure, there is provided a substrate processing apparatus that processes a substrate by supplying a process gas into a reaction tube, the apparatus including: a cleaning gas supply part configured to supply a cleaning gas into the reaction tube; a discharge part configured to discharge the process gas or the cleaning gas from an interior of the reaction tube; and a cleaning control part configured to control the cleaning gas supply part and the discharge part so as to remove a deposit adhering to the reaction tube by discharging a predetermined gas generated by a reaction of the deposit and the cleaning gas, wherein the discharge part includes a measuring part configured to measure a concentration of the predetermined gas, and the cleaning control part acquires a signal indicating the concentration of the predetermined gas using the measuring part and determines whether the acquired signal reaches a predetermined threshold value and then converges within a range between predetermined upper and lower limit values.

[Supplementary Note 66]

According to another aspect of the present disclosure, there is provided a non-transitory computer-readable recording medium which stores a cleaning completion determining program configured to remove a deposit adhering to a reaction tube, the program including: cleaning the reaction tube by supplying a cleaning gas into the reaction tube; measuring a concentration of a predetermined gas contained in a gas discharged from the reaction tube; and determining whether a signal indicating the concentration reaches a predetermined threshold value and then converges within a range between predetermined upper and lower limit values.

This application is based on, and claims the benefit of priority of, Japanese Patent Application No. 2013-020670 filed on Feb. 5, 2013, the entire disclosure of which is incorporated herein by reference.

INDUSTRIAL USE OF THE PRESENT DISCLOSURE

The present disclosure is suitably applied to a substrate processing apparatus which provides a maintenance-related technique.

EXPLANATION OF REFERENCE NUMERALS

1: substrate processing apparatus, 18: wafer

What is claimed is:

1. A substrate processing apparatus that processes a substrate provided into a process chamber by supplying a process gas, the substrate processing apparatus comprising:
   a cleaning gas supply that supplies a cleaning gas;
   a discharge port that discharges the process gas or the cleaning gas;
   a controller that controls the cleaning gas supply and the discharge port so as to remove a deposit adhering to a component constituting the apparatus by discharging a predetermined gas generated by a reaction of the deposit and the cleaning gas; and
   a concentration detector, communicatively coupled to the controller, that measures a concentration of the predetermined gas in a discharge path connected to the process chamber,
   wherein the controller includes a memory that stores a recipe including a cleaning step of executing a cleaning process and a sub-recipe for removing the deposit adhering to the component constituting the apparatus, and
   wherein the controller is configured to:
   read the recipe and the sub-recipe from the memory;
   control the cleaning gas supply and the discharge port by executing the cleaning step of the recipe and executing the sub-recipe a multiple number of times in the cleaning step, the sub-recipe being executed by performing a cycle the multiple number of times, and the cycle including performing, in a time series manner:
      a gas cleaning process of supplying the cleaning gas by the cleaning gas supply; and
      an exhaust process of discharging the cleaning gas by the discharge port;
   monitor, after executing the sub-recipe a predetermined number of times, a signal from the concentration detector while subsequently executing the sub-recipe;
   determine, based on the signal, that the concentration of the predetermined gas reaches a predetermined upper limit value or less;
   determine, based on the signal and the multiple number of times that the cycle is performed, an execution end point of the sub-recipe such that after the concentration of the predetermined gas reaches the upper limit value or less, the concentration of the predetermined gas stays within a range between the predetermined upper limit value and a predetermined lower limit value for a predetermined time period while executing the sub-recipe;
   terminate the sub-recipe by terminating the controlling of the cleaning gas supply and the discharge port at the execution end point to return to the recipe; and
   execute one or more remaining steps in the recipe after the cleaning step and terminate the recipe.

2. The substrate processing apparatus of claim 1, wherein the concentration detector is installed in the discharge path at a downstream side of a pump installed in the discharge path.

3. The substrate processing apparatus of claim 1, wherein the concentration detector includes: a collecting part configured to collect at least a part of a gas discharged from the process chamber; and an extracting part configured to extract the predetermined gas contained in the at least a part of the gas collected by the collecting part.

4. The substrate processing apparatus of claim 1, wherein the concentration detector includes a plurality of measuring portions installed in the discharge path.

5. The substrate processing apparatus of claim 1, wherein the sub-recipe is executed a number of times that ranges from a first predetermined number to a second predetermined number greater than the first predetermined number.

6. The substrate processing apparatus of claim 5, wherein the first predetermined number is a number of times the sub-recipe has been executed when the controller determines that the signal indicating the concentration of the predetermined gas reaches the predetermined upper limit value for a first time, and
   wherein the first predetermined number is a numerical value obtained by dividing a current cumulative film thickness value by a film thickness value which indicates an amount of a film that is being removed when the sub-recipe is executed once.

7. The substrate processing apparatus of claim 5, wherein if a number of times the sub-recipe including the gas cleaning process is executed exceeds the second predetermined number, an alarm indicating an end point detection incapability is notified.

8. The substrate processing apparatus of claim 5, wherein the recipe for removing the deposit is terminated if a number of times the recipe is executed while the controller determines that the signal indicating the concentration of the predetermined gas stays within the range between the predetermined upper and lower limit values for the predetermined time period is equal to or less than the second predetermined number.

9. The substrate processing apparatus of claim 5, wherein a maximum value and a minimum value of the signal acquired during the execution of the recipe are monitored, and if a number of times which the maximum value and the minimum value of the signal consecutively are maintained within the range between the predetermined upper and lower limit values reaches a third predetermined number between the first predetermined number and the second predetermined number, the controller determines cleaning completion as normal.

10. The substrate processing apparatus of claim 1, wherein the predetermined gas is at least one selected from a group consisting of silicon tetrafluoride (SiF4), silicon tetrachloride (SiCl4), nitrogen trifluoride (NF3), titanium tetrachloride (TiCl4), titanium tetrafluoride (TiF4), tungsten tetrafluoride (WF4), tungsten hexafluoride (WF6), aluminum tetrafluoride (AlF4), hafnium tetrachloride (HfCl4), hafnium tetrafluoride (HfF4) and a byproduct thereof.

11. The substrate processing apparatus of claim 1, wherein the predetermined number of times is a numerical value obtained by dividing a current cumulative film thickness value by a film thickness value which indicates an amount of a film that is being removed when the sub-recipe is executed once.

12. The substrate processing apparatus of claim 1, wherein the sub-recipe is executed the predetermined number of times that ranges from a first predetermined number to a second predetermined number.

13. The substrate processing apparatus of claim 12, wherein after the sub-recipe is executed the predetermined number of times, a maximum value and a minimum value of the signal acquired during the execution of the sub-recipe are monitored, and if the number of times the maximum value and the minimum value of the signal consecutively are maintained within the range between the predetermined upper and lower limit values reaches a third predetermined number between the first predetermined number and the second predetermined number, cleaning completion is determined as normal.

14. The substrate processing apparatus of claim 12, wherein if the number of times the sub-recipe is executed exceeds the second predetermined number, cleaning completion is determined as abnormal and an alarm indicating an end point detection incapability is notified.

15. The substrate processing apparatus of claim 14, wherein after the cleaning completion determination, a next step of the recipe for removing the deposit is executed and the recipe for removing the deposit is terminated.

16. The substrate processing apparatus of claim 1, wherein after the sub-recipe is executed the predetermined number of times, whether a maximum value and a minimum value of the signal acquired during the execution of the sub-recipe are maintained within the range between the predetermined upper and lower limit values is confirmed.

* * * * *